(12) United States Patent
Tanaka

(10) Patent No.: US 11,349,444 B2
(45) Date of Patent: May 31, 2022

(54) TRANSIMPEDANCE AMPLIFIER CIRCUIT

(71) Applicant: SUMITOMO ELECTRIC INDUSTRIES, LTD., Osaka (JP)

(72) Inventor: Keiji Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 26 days.

(21) Appl. No.: 16/937,060

(22) Filed: Jul. 23, 2020

(65) Prior Publication Data
US 2021/0036671 A1 Feb. 4, 2021

(30) Foreign Application Priority Data

Jul. 30, 2019 (JP) .............................. JP2019-140075
Jul. 30, 2019 (JP) .............................. JP2019-140077
Jul. 30, 2019 (JP) .............................. JP2019-140082

(51) Int. Cl.
*H03F 3/08* (2006.01)
*H03F 3/45* (2006.01)

(52) U.S. Cl.
CPC ........... *H03F 3/45179* (2013.01); *H03F 3/08* (2013.01); *H03F 3/087* (2013.01);
(Continued)

(58) Field of Classification Search
CPC . H03F 3/08; H03F 3/082; H03F 3/087; H03F 3/45; H03F 3/45179; H03F 2200/129; H03F 2203/45116; H03F 2203/45512; H03F 2203/45594; H03F 1/086; H03F 3/45183; H03F 3/45197; H03F 3/45475; H03F 3/45174; H03F 3/45273; H03G 3/3084
(Continued)

(56) References Cited

U.S. PATENT DOCUMENTS 9,774,305 B1 9/2017 Broekaert
2011/0316622 A1 12/2011 Hara
(Continued)

FOREIGN PATENT DOCUMENTS

JP 2012-010107 1/2012

OTHER PUBLICATIONS

Notice of Allowance for U.S. Appl. No. 16/935,949 dated Jan. 7, 2022.

*Primary Examiner* — Khanh V Nguyen
(74) *Attorney, Agent, or Firm* — Smith, Gambrell & Russell, LLP.

(57) ABSTRACT

In a transimpedance amplifier circuit, a control current circuit generates a control current based on a voltage signal and a reference voltage signal and includes an integrating circuit that generates a differential integral signal based on the voltage signal and the reference voltage signal, and a transconductance amplifying circuit that includes a first transconductance circuit that generates a first output current in accordance with the differential integral signal, a second transconductance circuit that generates a second output current in accordance with the differential integral signal, and a current source that supplies a third output current, and a control circuit has an input electrically connected to an output of the first transconductance circuit, an output of the second transconductance circuit, and an output of the current source.

11 Claims, 13 Drawing Sheets

(52) U.S. Cl.
CPC ............... *H03F 2200/129* (2013.01); *H03F 2203/45116* (2013.01); *H03F 2203/45512* (2013.01); *H03F 2203/45594* (2013.01)

(58) Field of Classification Search
USPC .................................................. 330/301, 308
See application file for complete search history.

(56) References Cited

U.S. PATENT DOCUMENTS

| | | | |
|---|---|---|---|
| 2015/0372648 A1* | 12/2015 | Sugimoto | ............... H03F 1/083 330/2 |
| 2019/0173588 A1* | 6/2019 | Ahmed | ................ H04B 10/693 |
| 2020/0007087 A1 | 1/2020 | Sugimoto | |

* cited by examiner

Fig.3
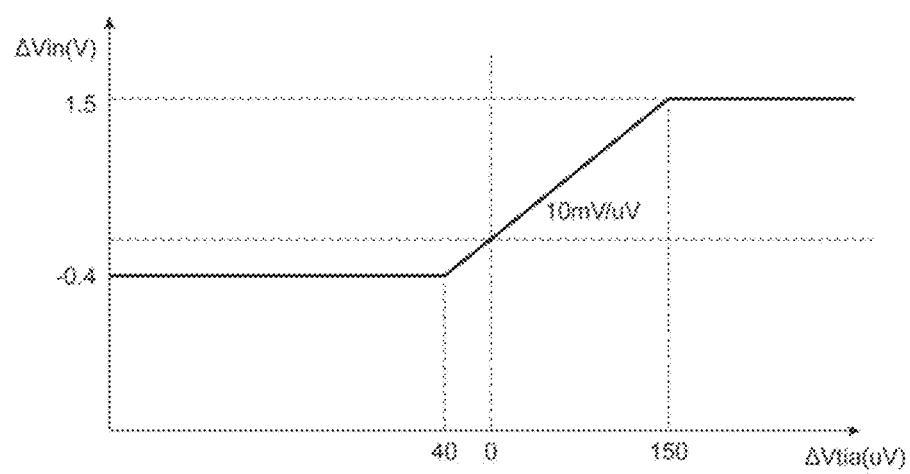
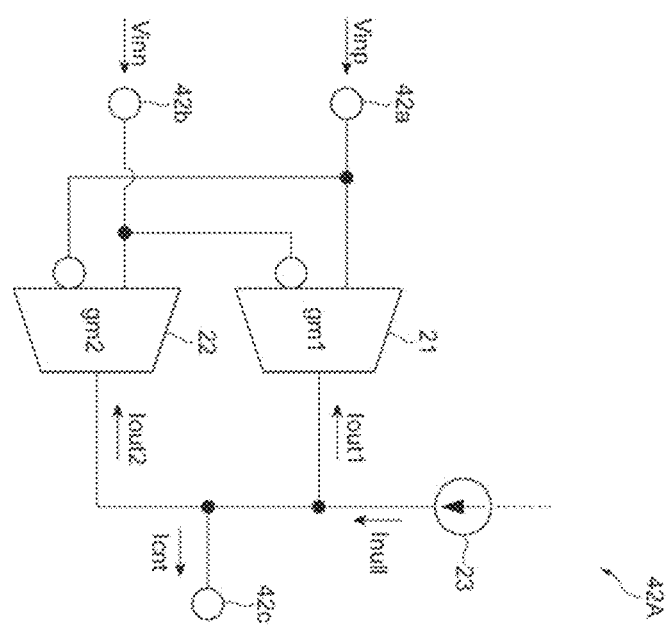
Fig.4

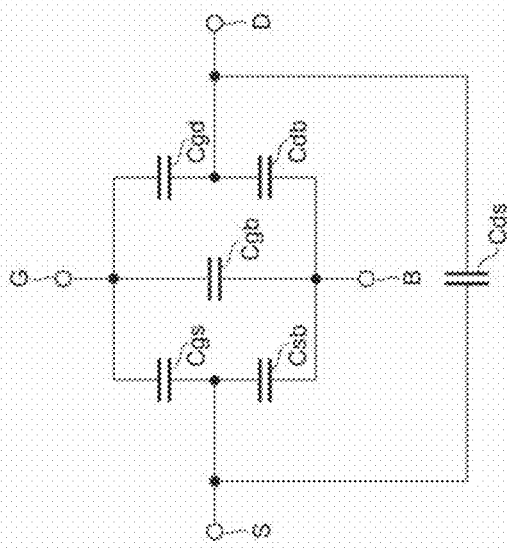

TRANSIMPEDANCE AMPLIFIER CIRCUIT

TECHNICAL FIELD

The present disclosure relates to a transimpedance amplifier circuit.

The present application claims priority based on Japanese Patent Application Nos. 2019-140075, 2019-140077, and 2019-140082, which were filed on Jul. 30, 2019, the entire content disclosed in the aforementioned Japanese patent applications being incorporated herein by reference.

BACKGROUND

In Ethernet (registered trademark) Passive Optical Network (EPON) that is an optical access system, a transimpedance amplifier circuit is used for an optical receiver of an optical line terminal (OLT). The optical receiver of the OLT receives burst optical signals from a plurality of optical network units (ONUs) by time division multiplexing (TDM). A transmission path loss from each ONU to the OLT differs depending on a distance from the OLT. Accordingly, a signal intensity from a ONU located relatively closer to the OLT is larger, and, relative to the ONU, the signal intensity from another ONU located farther from the OLT is smaller. As described above, burst optical signals with various signal intensities are input to the optical receiver of the OLT. Thus, the transimpedance amplifier circuit included in the optical receiver of the OLT includes a feedback control circuit that draws a bypass current from a current signal corresponding to the burst optical signal so that the burst optical signal with various signal intensities can be received (see, for example, Japanese Unexamined Patent Publication No. 2012-10107).

Japanese Unexamined Patent Publication No. 2012-10107 describes an amplifier circuit including an amplifier that converts an input current into an output voltage, a differential amplifier that converts the output voltage into a differential output signal, and a bypass circuit that draws a bypass current from a photocurrent generated in a photodiode. This amplifier circuit has a function of setting a time constant of the feedback control circuit to a small value in order to operate an automatic gain control at a high speed in an initial stage (preamble) of the burst signal and setting the time constant of the feedback control circuit to a large value in order to increase a consecutive identical digits (CID) tolerance in a payload of the burst signal.

However, in the amplifier circuit described in Japanese Unexamined Patent Publication No. 2012-10107, a forward voltage of a diode is controlled by an emitter follower circuit provided in an output part of the bypass circuit, so that an output voltage of the emitter follower circuit is fed back after being divided by on-resistance of the diode and an input impedance of the amplifier. Since the on-resistance of the diode may change according to a signal level (signal intensity) of the burst optical signal, the time constant of a feedback control depends on the signal intensity of the burst optical signal. For example, when a large signal having a large signal intensity is input, the on-resistance of the diode becomes small, so that a loop transfer gain becomes large, and the time constant of the feedback control becomes small. It is desirable that the time constant of the feedback control be kept constant regardless of the signal intensity of the burst optical signal.

The present disclosure will describe a transimpedance amplifier circuit capable of controlling a variation in control time constant due to a change in signal intensity of a burst optical signal.

SUMMARY

A transimpedance amplifier circuit according to one aspect of the present disclosure is a circuit that generates a differential voltage signal in accordance with an input current signal generated by a photodetector. This transimpedance amplifier circuit includes an input terminal that receives an input current signal, a single-input amplifier that converts a current signal into a voltage signal, a differential amplifier circuit that generates a differential voltage signal based on the voltage signal and a reference voltage signal, a control current circuit that generates a control current based on the voltage signal and the reference voltage signal, and a bypass circuit that generates a direct current (DC) bypass current and an alternating current (AC) bypass current based on the control current. The bypass circuit is electrically connected to the input terminal. The bypass circuit includes a control circuit that receives the control current, a feedback current source that generates the DC bypass current, and a variable resistance circuit that generates the AC bypass current. The control current circuit includes an integrating circuit that generates a differential integral signal based on the voltage signal and the reference voltage signal, and a transconductance amplifying circuit that receives the differential integral signal. The transconductance amplifying circuit includes a first transconductance circuit, a second transconductance circuit, and a current source. The first transconductance circuit generates a first output current in accordance with the differential integral signal. The second transconductance circuit generates a second output current in accordance with the differential integral signal. The current source supplies a third output current. The control circuit has an input electrically connected to an output of the first transconductance circuit, an output of the second transconductance circuit, and an output of the current source.

BRIEF DESCRIPTION OF THE DRAWINGS

FIG. 3 is a diagram showing a direct current (DC) input/output characteristic example of the integrating circuit shown in FIG. 2;

FIG. 4 is a diagram schematically showing a configuration of an OTA shown in FIG. 1;

FIG. 17 is a diagram for explaining an inter-terminal capacitance of a field effect transistor shown in FIG. 16;

FIG. 18 is a diagram showing an example of a capacitance value of the inter-terminal capacitance shown in FIG. 17;

DETAILED DESCRIPTION

Specific examples of a transimpedance amplifier circuit according to embodiments of the present disclosure will be described hereinafter with reference to the drawings. The present disclosure is not limited to these exemplifications. It is intended that the present invention is defined by the claims and includes all changes within the meaning and range equivalent to the claims.

Figure 1:
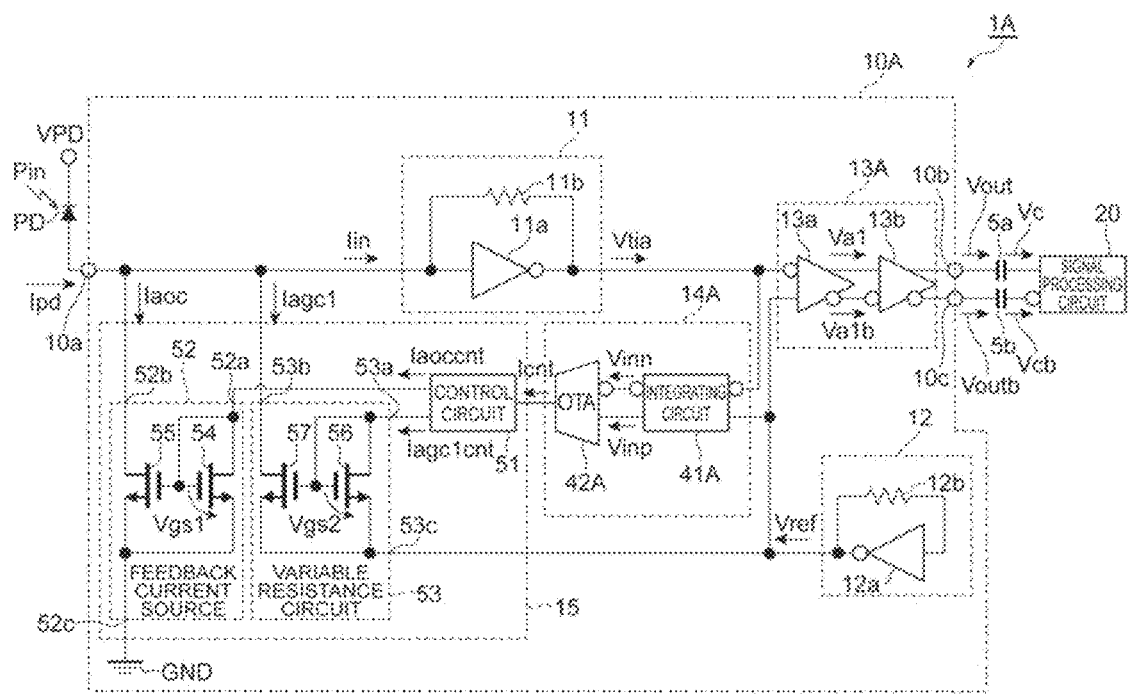
FIG. 1 is a diagram schematically showing a configuration of an optical receiving device including a transimpedance amplifier circuit according to an embodiment.
Figure 2:
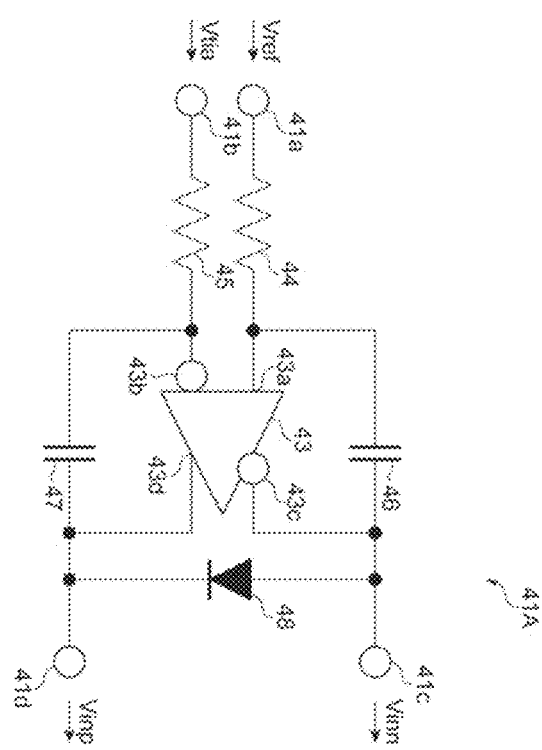
FIG. 2 is a diagram showing a circuit configuration example of an integrating circuit shown in FIG. 1.
Figure 6:
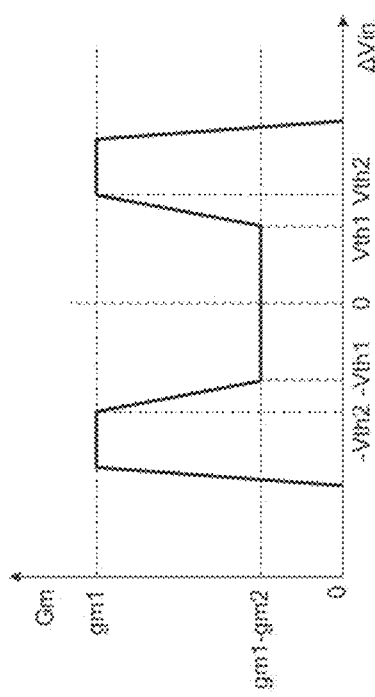
FIG. 6 is a diagram showing transconductance characteristics of the OTA shown in FIG. 1.
Figure 5:
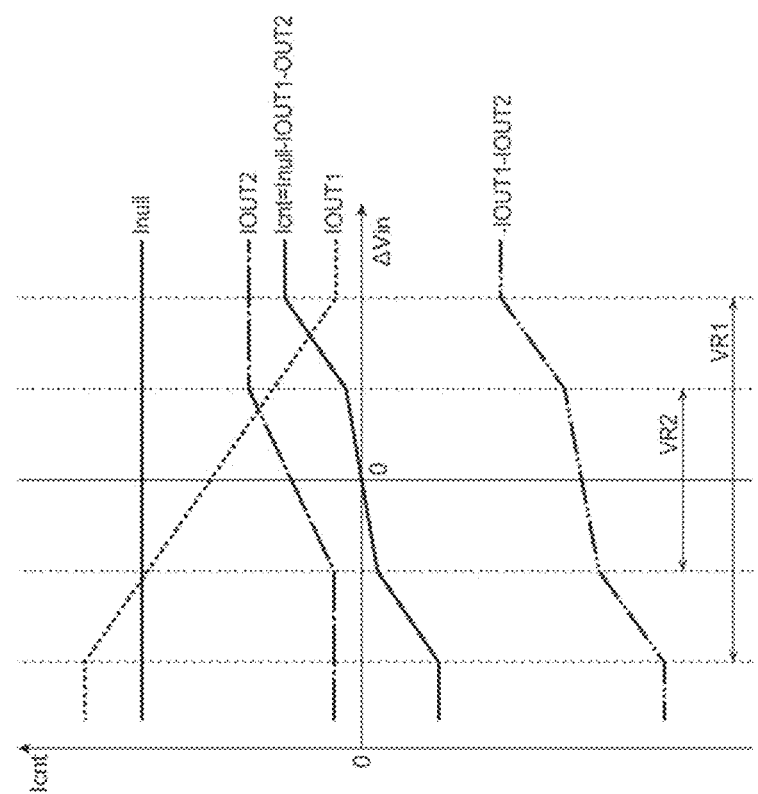
FIG. 5 is a diagram showing input/output current characteristics of the OTA shown in FIG. 1.
Figure 7:
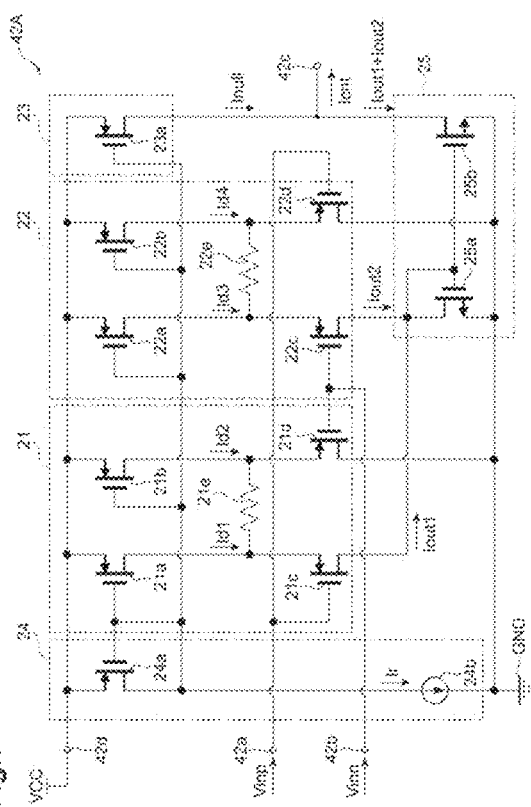
FIG. 7 is a diagram showing a circuit configuration example of the OTA shown in FIG. 4.
Figure 8:
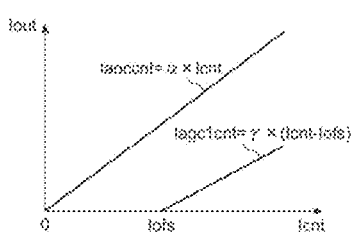
FIG. 8 is a diagram showing a relationship between a control current supplied to a control circuit shown in FIG. 1 and currents generated by the control circuit.
Figure 9:
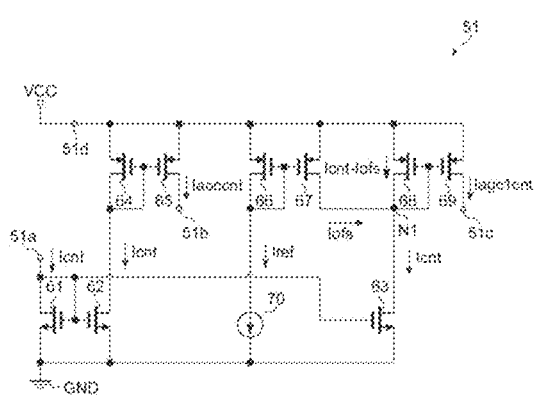
FIG. 9 is a diagram showing a circuit configuration example of the control circuit shown in FIG. 1.

FIG. 1 is a diagram schematically showing a configuration of an optical receiving device including a transimpedance amplifier circuit according to an embodiment. FIG. 2 is a diagram showing a circuit configuration example of an integrating circuit shown in FIG. 1. FIG. 3 is a diagram showing a DC input/output characteristic example of the integrating circuit shown in FIG. 2. FIG. 4 is a diagram schematically showing a configuration of an OTA shown in FIG. 1. FIG. 5 is a diagram showing input/output current characteristics of the OTA shown in FIG. 1. FIG. 6 is a diagram showing transconductance characteristics of the OTA shown in FIG. 1. FIG. 7 is a diagram showing a circuit configuration example of the OTA shown in FIG. 4. FIG. 8 is a diagram showing a relationship between a control current supplied to a control circuit shown in FIG. 1 and currents generated by the control circuit. FIG. 9 is a diagram showing a circuit configuration example of the control circuit shown in FIG. 1.

An optical receiving device 1A shown in FIG. 1 receives an optical signal Pin transmitted from an optical transmitting device (not shown). The optical receiving device 1A includes a photodetector PD, a transimpedance amplifier circuit 10A, and a signal processing circuit 20. The optical receiving device 1A may be, for example, a receiver of an OLT. The photodetector PD receives the optical signal Pin and generates a photocurrent Ipd (input current signal) in response to the optical signal Pin. The optical signal Pin is, for example, a burst optical signal. The photocurrent Ipd may include an alternating current (AC) component corresponding to a modulated signal and a DC component superimposed on the AC component. When a signal intensity (optical power) of the optical signal Pin increases, the AC component and the DC component of the photocurrent Ipd increase. When the signal intensity (optical power) of the optical signal Pin decreases, the AC component and the DC component of the photocurrent Ipd decrease. Examples of the photodetector PD include a photodiode and an avalanche photodiode. One terminal (for example, cathode) of the photodetector PD is electrically connected to a predetermined bias voltage VPD, and the other terminal (for example, anode) of the photodetector PD outputs the photocurrent Ipd. Generally, photodiodes are used with a reverse bias. Here, the term being "electrically connected" means that, for example, a cathode of the photodetector PD is connected to a circuit that generates the bias voltage VPD via wire bonding, and means connection in a state capable of transmitting signals and supplying current and voltage between the two electrically connected to each other. Therefore, the term being "electrically connected" may include direct connection by wiring and indirect connection through another electric element. The term being "electrically connected" is used in the same meaning in the following description.

The transimpedance amplifier circuit 10A receives the photocurrent Ipd generated by the photodetector PD in accordance with the optical signal Pin and generates a differential voltage signal Vout,Voutb, which is a voltage signal, in accordance with the photocurrent Ipd. The differential voltage signal Vout,Voutb includes a pair of complementary signals. The transimpedance amplifier circuit 10A includes, for example, an input terminal 10a and output terminals 10b and 10c. The photocurrent Ipd is input to the input terminal 10a. The output terminal 10b outputs the positive phase component Vout to the outside of the transimpedance amplifier circuit 10A. The output terminal 10c outputs the negative phase component Voutb to the outside of the transimpedance amplifier circuit 10A. For example, when the transimpedance amplifier circuit 10A is manufactured as one semiconductor integrated device (for example, a semiconductor chip) by a semiconductor process, the input terminal 10a may be a bonding pad formed on the semiconductor chip. When the semiconductor chip on which the transimpedance amplifier circuit 10A is formed is mounted in a certain package, the input terminal 10a may be an electric terminal provided on an outer surface of the package. The output terminals 10b and 10c are similar to the input terminal 10a, and may be a bonding pad formed on a semiconductor chip or an electric terminal provided on an outer surface of the package. That is, as an embodiment, the transimpedance amplifier circuit 10A may be formed on one semiconductor chip or may be mounted in one package or on a substrate.

The output terminals 10b and 10c are electrically connected to the signal processing circuit 20 via capacitors 5a and 5b, respectively. The capacitors 5a and 5b are AC coupling capacitors. The capacitors 5a and 5b remove the DC component of the differential voltage signal Vout,Voutb in the transimpedance amplifier circuit 10A. The DC component is removed from the differential voltage signal Vout, Voutb to generate a differential voltage signal Vc,Vcb, and the differential voltage signal Vc,Vcb is supplied to the signal processing circuit 20. For example, the differential voltage signal Vc,Vcb includes a pair of complementary signals. A positive phase component Vc (positive phase signal) of the differential voltage signal Vc,Vcb has a phase different from the phase of the negative phase component Vcb (negative phase signal) of the differential voltage signal Vc,Vcb by 180°. For example, the negative phase signal Vcb decreases when the positive phase signal Vc increases, and the negative phase signal Vcb increases when the positive phase signal Vc decreases. When the positive phase signal Vc reaches a maximum value (peak value), the negative phase signal Vcb reaches a minimum value (bottom value). When the positive phase signal Vc reaches the bottom value, the negative phase signal Vcb reaches the peak value. The positive phase signal Vc and the negative phase signal Vcb may have the same amplitude and the same time-average value. For example, assuming that an output impedance in a differential of the transimpedance amplifier circuit 10A (output amplifier 13b described below) is 100Ω, an input impedance in a differential of the signal processing circuit 20 is 100Ω, and each capacitance value of the capacitors 5a and 5b is 1000 pF, a time constant of 100 nsec is generated by the capacitors 5a and 5b when the differential voltage signal Vc,Vcb is input to the signal processing circuit 20.

The transimpedance amplifier circuit 10A includes a transimpedance amplifier (TIA) unit 11 (single-input amplifier), a reference voltage generation circuit 12, a differential amplifier circuit 13A, a control current circuit 14A, and a bypass circuit 15.

The TIA unit 11 is a circuit that converts a current signal Iin into a voltage signal Vtia. Specifically, the TIA unit 11 includes a voltage amplifier 11a and a feedback resistance element (resistor) 11b. The input terminal and output terminal of the voltage amplifier 11a are electrically connected to each other via the feedback resistance element 11b. That is, the feedback resistance element 11b is electrically connected between the input and output of the voltage amplifier 11a. The current signal Iin is generated by drawing a DC bypass current Iaoc and an AC bypass current Iagc1 (first AC bypass current) from the photocurrent Ipd. The DC bypass current Iaoc and the AC bypass current Iagc1 are controlled by the bypass circuit 15, that will be described in detail later. An increase/decrease of the voltage signal Vtia is inverted with respect to an increase/decrease of the current signal Iin. For example, when a magnitude of the current signal Iin increases, a voltage value of the voltage signal Vtia decreases (lowers). The voltage amplifier 11a is, for example, an inverting amplifier circuit. The TIA unit 11 outputs the voltage signal Vtia to the differential amplifier circuit 13A and the control current circuit 14A. A gain (a ratio of an amount of change in the voltage signal Vtia to an amount of change in the current signal Iin) of the TIA unit 11 is determined by a resistance value (transimpedance) of the feedback resistance element 11b. The input impedance of the TIA unit 11 is, for example, about 10 to 100Ω.

The reference voltage generation circuit 12 is a circuit that generates a reference voltage signal Vref that is a DC voltage signal. The reference voltage generation circuit 12 supplies the reference voltage signal Vref to the differential amplifier circuit 13A, the control current circuit 14A, and the bypass circuit 15. The reference voltage signal Vref has, for example, a predetermined voltage value (fixed value). The reference voltage generation circuit 12 may be configured so that an output impedance of a terminal that supplies the reference voltage signal Vref is a low impedance over a wide band. In the present embodiment, the reference voltage generation circuit 12 is a dummy TIA including, for example, a voltage amplifier 12a (amplifier) and a feedback resistance element (resistor) 12b, and having the same circuit configuration as the TIA unit 11. Specifically, the input terminal and output terminal of the voltage amplifier 12a are electrically connected to each other via the feedback resistance element 12b. That is, the feedback resistance element 12b is electrically connected between the input and output of the voltage amplifier 12a. Since the reference voltage generation circuit 12 has the same circuit configuration as the TIA unit 11, the reference voltage signal Vref can be generated so as to compensate (cancel) the change in the voltage signal Vtia due to a change in the power supply voltage and temperature of the voltage amplifier 11a.

The differential amplifier circuit 13A is a circuit that generates the differential voltage signal Vout,Voutb in accordance with a difference ΔVtia between the voltage signal Vtia and the reference voltage signal Vref. In other words, the differential amplifier circuit 13A uses the reference voltage signal Vref to convert the single (single-phase) voltage signal Vtia into the differential voltage signal Vout, Voutb. The differential amplifier circuit 13A includes, for example, a differential amplifier 13a and an output amplifier 13b. For example, when the differential amplifier 13a is an inverting amplifier and the output amplifier 13b is a non-inverting amplifier, the differential amplifier circuit 13A performs inverting amplification. For example, when the voltage value of the voltage signal Vtia is larger than the voltage value of the reference voltage signal Vref, the voltage value of the positive phase component Vout of the differential voltage signal Vout,Voutb becomes smaller than the voltage value of the negative phase component Voutb of the differential voltage signal Vout,Voutb. When the voltage value of the voltage signal Vtia is smaller than the voltage value of the reference voltage signal Vref, the voltage value of the positive phase component Vout of the differential voltage signal Vout,Voutb becomes larger than the voltage value of the negative phase component Voutb of the differential voltage signal Vout,Voutb.

The differential amplifier 13a generates a differential voltage signal Va1,Va1b by amplifying the difference ΔVtia. The differential amplifier 13a outputs the differential voltage signal Va1,Va1b to the output amplifier 13b. The output amplifier 13b is a circuit that amplifies the differential voltage signal Va1,Va1b. The output amplifier 13b generates the differential voltage signal Vout,Voutb by amplifying the differential voltage signal Va1,Va1b. The positive phase component Vout (positive phase signal) of the differential voltage signal Vout,Voutb has a phase different from the phase of the negative phase component Voutb (negative phase signal) of the differential voltage signal Vout,Voutb by 180°. For example, the negative phase signal Voutb decreases when the positive phase signal Vout increases, and the negative phase signal Voutb increases when the positive phase signal Vout decreases. When the positive phase signal Vout reaches a maximum value (peak value), the negative phase signal Voutb reaches a minimum value (bottom value). When the positive phase signal Vout reaches the bottom value, the negative phase signal Voutb reaches the peak value. The positive phase signal Vout and the negative phase signal Voutb may have the same amplitude and the same time-average value. A difference between the time-average value of the positive phase component voltage of the differential voltage signal and the time-average value of the negative phase component voltage of the differential voltage signal is referred to as the DC offset. For example, a difference between the time-average value of the voltage of the positive phase signal Vout and the time-average value of the voltage of the negative phase signal Voutb is the DC offset. In the following description, the simple term "DC offset" will refer to the difference between the time-average value of the voltage of the positive phase signal Vout and the time-average value of the voltage of the negative phase signal Voutb. The DC offset is preferably small in signal transmission. The output amplifier 13b outputs the differential voltage signal Vout,Voutb to the outside of the transimpedance amplifier circuit 10A via the output terminals 10b and 10c.

The control current circuit 14A is a circuit that generates the control current Icnt based on an integrated value of the difference ΔVtia between the voltage signal Vtia and the reference voltage signal Vref. The difference ΔVtia is a signal (voltage value) obtained by subtracting the voltage signal Vtia from the reference voltage signal Vref. The control current circuit 14A includes an integrating circuit 41A and an operational transconductance amplifier (OTA) 42A (transconductance amplifying circuit).

The integrating circuit 41A is a circuit that integrates the difference ΔVtia to generate a differential integral signal (voltage signal Vinp and voltage signal Vinn). As shown in FIG. 2, the integrating circuit 41A has input terminals 41a and 41b and output terminals 41c and 41d. The input terminal 41a is electrically connected to the output terminal of the reference voltage generation circuit 12 (voltage amplifier 12a), and the reference voltage signal Vref is input to the input terminal 41a. The input terminal 41b is electrically connected to the output terminal of the TIA unit 11 (voltage amplifier 11a), and the voltage signal Vtia is input to the input terminal 41b. The output terminal 41c (first output terminal) is electrically connected to an input terminal 42b that is an inverting input terminal of an OTA 42A described later, and outputs the voltage signal Vinn that is the negative phase component of the differential integral signal to the OTA 42A. The output terminal 41d (second output terminal) is electrically connected to an input terminal 42a that is a non-inverting input terminal of the OTA 42A, and outputs the voltage signal Vinp that is the positive phase component of the differential integral signal to the OTA 42A. For example, when the voltage value of the voltage signal Vtia is larger than the voltage value of the reference voltage signal Vref, the voltage value of the voltage signal Vinp becomes smaller than the voltage value of the voltage signal Vinn.

The integrating circuit 41A includes an operational amplifier 43, resistance elements (resistors) 44 and 45, capacitors 46 and 47, and a diode 48. The operational amplifier 43 has a non-inverting input terminal 43a, an inverting input terminal 43b, an inverting output terminal 43c, and a non-inverting output terminal 43d. The non-inverting input terminal 43a is electrically connected to the input terminal 41a via the resistance element 44. The inverting input terminal 43b is electrically connected to the input terminal 41b via the resistance element 45. The inverting output terminal 43c is electrically connected to the output terminal 41c and is also electrically connected to the non-inverting input terminal 43a via the capacitor 46. That is, the capacitor 46 is connected so as to apply negative feedback from the inverting output terminal 43c to the non-inverting input terminal 43a. The non-inverting output terminal 43d is electrically connected to the output terminal 41d and is also electrically connected to the inverting input terminal 43b via the capacitor 47. That is, the capacitor 47 is connected so as to apply negative feedback from the non-inverting output terminal 43d to the inverting input terminal 43b. Regarding a change in output with respect to a change in input, for example, when the voltage value of the voltage signal Vtia is larger than the voltage value of the reference voltage signal Vref, the voltage value of the voltage signal Vinp becomes smaller than the voltage value of the voltage signal Vinn.

Here, it is assumed that the gain of the operational amplifier 43 is, for example, 1000 times or more, a resistance value R1 of the resistance element 44 and a resistance value R2 of the resistance element 45 are equal to each other, and a capacitance value C1 of the capacitor 46 and a capacitance value C2 of the capacitor 47 are equal to each other. In this case, the gain of the operational amplifier 43 is considered to be infinite, and the integrating circuit 41A operates as an integrator having a time constant R1×C1.

The diode 48 is provided between the output terminal 41c and the output terminal 41d. An anode of the diode 48 is electrically connected to the output terminal 41c. A cathode of the diode 48 is electrically connected to the output terminal 41d. An on-voltage (forward voltage) of the diode 48 is set to a low voltage from the viewpoint of high-speed operation of a control loop. In the example shown in FIG. 3, the gain (voltage gain) of the operational amplifier 43 is 10,000 times (80 dB), and the on-voltage of the diode 48 is 0.4 V. The integrating circuit 41A has a characteristic that a difference ΔVin changes by 10 mV when the difference ΔVtia changes by 1 μV. The difference ΔVin is a signal (voltage value) obtained by subtracting the voltage signal Vinn from the voltage signal Vinp, and is a voltage amplitude of the differential integral signal. In this example, the diode 48 is turned on when the difference ΔVin is less than −0.4 V. As a result, even if the difference ΔVtia increases on the minus side, the difference ΔVin is clamped at −0.4 V. On the other hand, when the difference ΔVin increases on the plus side, the difference ΔVin saturates without being increased to 1.5 V or more. As described above, the integrating circuit 41A has a characteristic asymmetrical about zero for the difference ΔVin.

The OTA 42A is a circuit that converts the differential integral signal (voltage signal Vinp and voltage signal Vinn) into the control current Icnt that is a single current signal (error current). The OTA 42A has an input/output characteristic that the transconduactance increases as the difference ΔVin increases when the difference ΔVin is a positive value.

As shown in FIG. 4, the OTA 42A has the input terminals 42a and 42b and an output terminal 42c. The input terminal 42a is electrically connected to the output terminal 41d of the integrating circuit 41A, and the voltage signal Vinp is input to the input terminal 42a. The input terminal 42b is electrically connected to the output terminal 41c of the integrating circuit 41A, and the voltage signal Vinn is input to the input terminal 42b. The output terminal 42c is electrically connected to an input terminal 51a of a control circuit 51 described later, and outputs the control current Icnt to the control circuit 51. The OTA 42A includes a transconductance circuit 21 (first transconductance circuit), a transconductance circuit 22 (second transconductance circuit), and a current source 23.

The transconductance circuit 21 is a circuit that generates an output current Iout1 (first output current) based on the differential integral signal (voltage signal Vinp and voltage signal Vinn). A non-inverting input terminal of the transconductance circuit 21 is electrically connected to the input terminal 42a and receives the voltage signal Vinp. The inverting input terminal of the transconductance circuit 21 is electrically connected to the input terminal 42b and receives the voltage signal Vinn. An output terminal of the transconductance circuit 21 outputs the output current Iout1.

As shown in FIG. 5, the transconductance circuit 21 operates such that in a range VR1 (first range) of the difference ΔVin, the output current Iout1 decreases as the difference ΔVin increases. The transconductance circuit 21 has a transconductance −gm1 (second transconductance) in the range VR1. The transconductance −gm1 corresponds to a gradient of the output current Iout1 in the range VR1 in FIG. 5. Since this gradient has a negative value, this gradient is expressed as −gm1 with gm1 as a positive real number for convenience. The transconductance circuit 21 holds a current value of the output current Iout1 at the upper limit value of the range VR1 when the difference ΔVin exceeds the upper limit value of the range VR1. The transconductance circuit 21 holds the current value of the output current Iout1 at the lower limit value of the range VR1 when the difference ΔVin falls below the lower limit value of the range VR1.

The transconductance circuit 22 is a circuit that generates an output current Iout2 (second output current) based on the differential integral signal (voltage signal Vinp and voltage signal Vinn). A non-inverting input terminal of the transconductance circuit 22 is electrically connected to the input terminal 42b and receives the voltage signal Vinn. An inverting input terminal of the transconductance circuit 22 is electrically connected to the input terminal 42a and receives the voltage signal Vinp. An output terminal of the transconductance circuit 22 outputs the output current Iout2.

As shown in FIG. 5, the transconductance circuit 22 operates such that in a range VR2 (second range) of the difference ΔVin, the output current Iout2 increases as the difference ΔVin increases. The transconductance circuit 22 has a transconductance gm2 in the range VR2. The transconductance gm2 corresponds to the gradient of the output current Iout2 in the range VR2 in FIG. 5. Where gm2 is a positive real number. The magnitude (absolute value) of the transconductance gm2 has a value different from the value of the magnitude (absolute value) of the transconductance −gm1 and is smaller than the magnitude (absolute value) of the transconductance −gm1. The range VR2 is narrower than the range VR1 and is included in the range VR1. That is, the upper limit value of the range VR2 is smaller than the upper limit value of the range VR1, and the lower limit value of the range VR2 is larger than the lower limit value of the range VR1. The transconductance circuit 22 holds a current value of the output current Iout2 at the upper limit value of the range VR2 when the difference ΔVin exceeds the upper limit value of the range VR2. The transconductance circuit 22 holds the current value of the output current Iout2 at the lower limit value of the range VR2 when the difference ΔVin falls below the lower limit value of the range VR2. That is, a linear operation range (range VR2) of the transconductance circuit 22 is narrower than a linear operation range (range VR1) of the transconductance circuit 21.

The current source 23 supplies a constant current Inull. The constant current Inull has a current value (fixed value) obtained by adding the current value of the output current Iout1 when the difference ΔVin is 0 and the current value of the output current Iout2 when the difference ΔVin is 0.

The OTA 42A generates the control current Icnt by adding the output current Iout1 and the output current Iout2. More specifically, the OTA 42A generates the control current Icnt by adding the output current Iout1 and the output current Iout2 and subtracting the addition result from the constant current Inull. By differentiating the control current Icnt by the difference ΔVin, a U-shaped transconductance characteristic having three flat portions shown in FIG. 6 can be obtained. A transconductance (gm1−gm2) (first transconductance) of the central flat portion is smaller than the transconductance gm1 of the flat portions on both sides of the central flat portion, and the control current Icnt is non-linear with respect to the difference ΔVin.

As shown in FIG. 6, when the difference ΔVin is near 0V, the transconductance of the OTA 42A is small, and the transconductance of the OTA 42A increases as the absolute value of the difference ΔVin increases. More specifically, when the absolute value of the difference ΔVin is smaller than a threshold value Vth1, the transconductance of the OTA 42A is a value (gm1−gm2) obtained by subtracting the transconductance gm2 from the transconductance gm1. When the absolute value of the difference ΔVin is larger than a threshold value Vth2, the transconductance of the OTA 42A is the transconductance gm1. When the absolute value of the difference ΔVin further increases and exceeds the linear operation range of the transconductance circuits 21 and 22, the transconductance of the OTA 42A decreases toward 0. This transconductance characteristic is line-symmetrical on the plus side and the minus side with the vertical axis of ΔVin=0 as the symmetry center. Therefore, the transconductance (gm1−gm2) of the flat portion near ΔVin=0 is smaller than the transconductance gm1 of the two flat portions outside the flat portion near ΔVin=0.

Due to this characteristic, when the difference ΔVin is larger than a threshold value −Vth1 and smaller than the threshold value Vth1, the OTA 42A uses the transconductance (gm1−gm2) to generate the control current Icnt in accordance with the differential integral signal Vinp,Vinn. When the difference ΔVin is smaller than the threshold value −Vth2 or larger than the threshold value Vth2, the OTA 42A uses the transconductance gm1 to generate the control current Icnt in accordance with the differential integral signal Vinp,Vinn. The transconductance gm1 is larger than the transconductance (gm1−gm2). In the example shown in FIG. 6, the threshold value Vth2 is larger than the threshold value Vth1. However, the threshold value Vth2 may be the same as the threshold value Vth1.

The OTA 42A can operate in both a direction of drawing the control current Icnt from the output terminal 42c into the OTA 42A and a direction of discharging the control current Icnt from the output terminal 42c to the outside of the OTA 42A. Thus, even if the control current Icnt is near 0 A, the transconductance of OTA 42A can be obtained. The U-shaped characteristic of the transconductance of the OTA 42A is arbitrarily set by adjusting the transconductances gm1 and gm2 and the ranges VR1 and VR2.

The OTA 42A shown in FIG. 7 has a circuit configuration for realizing the OTA 42A shown in FIG. 4. As shown in FIG. 7, the OTA 42A further includes a power supply terminal 42d in addition to the input terminals 42a and 42b and the output terminal 42c. The power supply terminal 42d is electrically connected to a power supply wiring that supplies a power supply voltage VCC, and the power supply voltage VCC is supplied to the power supply terminal 42d. The OTA 42A includes a bias circuit 24 and a combining circuit 25 in addition to the transconductance circuits 21 and 22 and the current source 23, for example.

The bias circuit 24 includes a transistor 24a and a current source 24b. The transistor 24a is, for example, a P-channel Metal-Oxide-Semiconductor (MOS) transistor. A source of the transistor 24a is electrically connected to the power supply terminal 42d. A gate and a drain of the transistor 24a are electrically connected to each other and further electrically connected to the current source 24b. A reference current Ir is supplied to the drain of the transistor 24a. The reference current Ir flows from the drain of the transistor 24a toward the current source 24b. The value of the reference current Ir is set by the current source 24b.

The transconductance circuit 21 includes transistors 21a, 21b, 21c, and 21d and a resistance element (resistor) 21e. The transistors 21a, 21b, 21c, and 21d are, for example, P-channel MOS transistors. Sources of the transistors 21a and 21b are electrically connected to the power supply terminal 42d via power supply wiring. Gates of the transistors 21a and 21b are electrically connected to the gate and drain of the transistor 24a. A drain of the transistor 21a is electrically connected to a source of the transistor 21c. A drain of the transistor 21b is electrically connected to a source of the transistor 21d.

The transistor 24a and each of the transistors 21a and 21b constitute a current mirror circuit. The transistor 24a functions as an input transistor of the current mirror circuit, and the transistors 21a and 21b function as output transistors of the current mirror circuit. For example, an output current (drain current Id1) having a magnitude proportional to the magnitude of the drain current (reference current Ir) of the transistor 24a is output from the drain of the transistor 21a. That is, when the input current (reference current Ir) is input to the input transistor, the output current (drain current Id1) having a magnitude proportional to the magnitude of the input current (reference current Ir) is output from the output transistor. Similarly, an output current (drain current Id2) having a magnitude proportional to the magnitude of the drain current (reference current Ir) of the transistor 24a is output from the drain of the transistor 21b. Thus, the transistors 21a and 21b function as a current source of the transconductance circuit 21.

The transistors 21c and 21d constitute a differential pair. A gate of the transistor 21c is electrically connected to the input terminal 42a, and the voltage signal Vinp is input to a gate of the transistor 21c. A drain of the transistor 21c is electrically connected to a drain and a gate of a transistor 25a described later. A gate of the transistor 21d is electrically connected to the input terminal 42b, and the voltage signal Vinn is input to the gate of the transistor 21d. A drain of the transistor 21d is electrically connected to a ground potential GND. The transistor 21c may have the same electrical characteristics as the transistor 21d. The resistance element 21e is electrically connected between the source of the transistor 21c and the source of the transistor 21d. The resistance element 21e has a resistance value Rgm1. The sizes of the transistors 21c and 21d are set so that the transconductances of the transistors 21c and 21d are sufficiently larger than 1/Rgm1. For example, the transconductance gm1 of the transconductance circuit 21 becomes larger than 1/Rgm1 by adjusting the gate length and gate width of the transistors 21c and 21d. The output current Iout1 is output from the drain of the transistor 21c.

The transconductance circuit 22 includes transistors 22a, 22b, 22c, and 22d and a resistance element 22e. The transistors 22a, 22b, 22c, and 22d are, for example, P-channel MOS transistors. Sources of the transistors 22a and 22b are electrically connected to the power supply terminal 42d. Gates of the transistors 22a and 22b are electrically connected to the gate and drain of the transistor 24a. A drain of the transistor 22a is electrically connected to a source of the transistor 22c. A drain of the transistor 22b is electrically connected to a source of the transistor 22d.

The transistor 24a and each of the transistors 22a and 22b constitute a current mirror circuit. The transistor 24a functions as an input transistor of the current mirror circuit, and the transistors 22a and 22b function as output transistors of the current mirror circuit. An output current (drain current Id3) having a magnitude proportional to the magnitude of the drain current (reference current Ir) of the transistor 24a is output from the drain of the transistor 22a. Similarly, an output current (drain current Id4) having a magnitude proportional to the magnitude of the drain current (reference current Ir) of the transistor 24a is output from the drain of the transistor 22b. Thus, the transistors 22a and 22b function as a current source of the transconductance circuit 22.

The transistors 22c and 22d constitute a differential pair. A gate of the transistor 22c is electrically connected to the input terminal 42b, and the voltage signal Vinn is input to the gate of the transistor 22c. A drain of the transistor 22c is electrically connected to the drain and gate of the transistor 25a described later. A gate of the transistor 22d is electrically connected to the input terminal 42a, and the voltage signal Vinp is input to the gate of the transistor 22d. A drain of the transistor 22d is electrically connected to the ground potential GND. The transistor 22c may have the same electrical characteristics as the transistor 22d. The resistance element 22e is electrically connected between the source of the transistor 22c and the source of the transistor 22d. The resistance element 22e has a resistance value Rgm2. The sizes of the transistors 22c and 22d are set so that the transconductances of the transistors 22c and 22d are sufficiently larger than 1/Rgm2. For example, the transconductance gm2 of the transconductance circuit 22 becomes larger than 1/Rgm2 by adjusting the gate length and gate width of the transistors 22c and 22d. The output current Iout2 is output from the drain of the transistor 22c.

The current source 23 includes a transistor 23a. The transistor 23a is, for example, a P-channel MOS transistor.

A source of the transistor 23*a* is electrically connected to the power supply terminal 42*d*. A gate of the transistor 23*a* is electrically connected to the gate and drain of the transistor 24*a*. A drain of the transistor 23*a* is electrically connected to the output terminal 42*c*. The transistor 24*a* and the transistor 23*a* constitute a current mirror circuit. The transistor 24*a* functions as an input transistor of the current mirror circuit, and the transistor 23*a* functions as an output transistor of the current mirror circuit. An output current (drain current) having a magnitude proportional to the magnitude of the drain current (reference current Ir) of the transistor 24*a* is output as the constant current Inull from the drain of the transistor 23*a* toward the output terminal 42*c*.

The combining circuit 25 includes the transistors 25*a* and 25*b*. The transistors 25*a* and 25*b* are, for example, N-channel MOS transistors. Sources of the transistors 25*a* and 25*b* are electrically connected to the ground potential GND. The gate and drain of the transistor 25*a* are electrically connected to each other and further electrically connected to the drains of the transistors 21*c* and 22*c*. A gate of the transistor 25*b* is electrically connected to the gate of the transistor 25*a*. A drain of the transistor 25*b* is electrically connected to the output terminal 42*c*.

The output current Iout1 output from the transconductance circuit 21 and the output current Iout2 output from the transconductance circuit 22 are combined in the combining circuit 25, and the combined current (Iout1+Iout2) flows to the transistor 25*a* diode-connected. The transistors 25*a* and 25*b* constitute a current mirror circuit. The transistor 25*a* functions as an input transistor of the current mirror circuit, and the transistor 25*b* functions as an output transistor of the current mirror circuit. An output current (drain current) having a magnitude proportional to the magnitude of the drain current (Iout1+Iout2) of the transistor 25*a* is output from the drain of the transistor 25*b*. Here, for example, a current mirror ratio is set to 1:1. The transistor 25*b* may have the same electrical characteristics as the transistor 25*a*.

A pull-in current Iout1+Iout2 generated by the combining circuit 25 and the constant current Inull output from the current source 23 are combined, and the combined current (Inull−(Iout1+Iout2)) is output as the control current Icnt from the output terminal 42*c*. Since the output terminal 42*c* is electrically connected to the transistor 23*a* and the transistor 25*b* that function as a current source, an output impedance of the OTA 42A is very high, and the OTA 42A operates as a transconductance amplifier. When the transistor 23*a* functions as a current source, the transistor 23*a* may operate in a saturation region of drain current-voltage characteristics. The transistor 25*b* may also operate in the saturation region of the drain current-voltage characteristics, for example.

The range VR1 of the difference ΔVin in which the transconductance circuit 21 operates linearly can be approximately represented by Rgm1×(Id1+Id2) using the drain current Id1 of the transistor 21*a* and the drain current Id2 of the transistor 21*b*. That is, a maximum value of the output current Iout1 is determined by (Id1+Id2). Similarly, the range VR2 of the difference ΔVin in which the transconductance circuit 22 operates linearly can be approximately represented by Rgm2×(Id3+Id4) using the drain current Id3 of the transistor 22*a* and the drain current Id4 of the transistor 22*b*. That is, a maximum value of the output current Iout2 is determined by (Id3+Id4).

The current characteristic shown in FIG. 5 can be realized by satisfying the condition of Formula (1). Thus, by adjusting the drain currents Id1, Id2, Id3, and Id4 and the resistance values Rgm1 and Rgm2, desired current characteristics can be obtained.

[Formula 1]

$$\begin{aligned} Id1 &= Id2 \\ Id3 &= Id4 \\ Rgm1 &< Rgm2 \\ Rgm1 \times (Id1 + Id2) &> Rgm2 \times (Id3 + Id4) \\ Inull &= \frac{Id1 + Id2 + Id3 + Id4}{2} \end{aligned} \quad (1)$$

The bypass circuit 15 is a circuit that generates the DC bypass current Iaoc and the AC bypass current Iagc1 based on the control current Icnt. The bypass circuit 15 includes, for example, a control circuit 51, a feedback current source 52, and a variable resistance circuit 53 (first variable resistance circuit).

The control current Icnt is input to the control circuit 51. The control circuit 51 controls the feedback current source 52 so that the DC bypass current Iaoc increases as the control current Icnt increases. When the control current Icnt exceeds a current value of an offset current Iofs, the control circuit 51 controls the variable resistance circuit 53 so that the AC bypass current Iagc1 increases as the control current Icnt increases. The current value of the offset current Iofs is a predetermined current value (fixed value), and is set to, for example, the current value of the control current Icnt when the difference ΔVin is the upper limit value of the range VR1. Specifically, the control circuit 51 receives the control current Icnt from the control current circuit 14A (OTA 42A), and generates a control current Iaoccnt (first control current) and a control current Iagc1cnt (second control current) in accordance with the control current Icnt. The control circuit 51 outputs the control current Iaoccnt to the feedback current source 52, and controls the feedback current source 52 by the control current Iaoccnt. The control circuit 51 outputs the control current Iagc1cnt to the variable resistance circuit 53, and controls the variable resistance circuit 53 by the control current Iagc1cnt.

As shown in FIG. 8, the current value of the control current Iaoccnt is proportional to the current value of the control current Icnt. The current value of the control current Iaoccnt is α times the current value of the control current Icnt (Iaoccnt=α×Icnt). An amplification factor α is a real number larger than 1, for example. The control circuit 51 generates the control current Iaoccnt by, for example, amplifying the control current Icnt with the amplification factor α (first amplification factor). The current value of the control current Iagc1cnt is proportional to the current value of the control current Icnt when the current value of the control current Icnt is larger than the current value of the offset current Iofs. In other words, the current value of the control current Iagc1cnt is γ times the current value obtained by subtracting the current value of the offset current Iofs from the control current Icnt (Iagc1cnt=γ×(Icnt−Iofs)). An amplification factor γ is a real number larger than 1, for example. The control circuit 51, for example, generates the offset current Iofs having a predetermined current value (offset current value), and generates the control current Iagc1cnt by amplifying a difference (difference current) between the current (in this case, the control current Icnt), generated by amplifying the control current Icnt, and the offset current Iofs with the amplification factor γ (second amplification factor). Thus, the amplification factor α is adjusted for generating the control current Iaoccnt. An offset current value for determining a current for starting automatic gain control (AGC) and the amplification factor γ for determining a control sensitivity of the AGC are adjusted for generating the control current Iagc1cnt.

The control circuit 51 shown in FIG. 9 has a circuit configuration for realizing the control current Iaoccnt and the control current Iagc1cnt shown in FIG. 8. As shown in FIG. 9, the control circuit 51 has, for example, the input terminal 51a, output terminals 51b and 51c, and a power supply terminal 51d. The input terminal 51a is electrically connected to the output terminal 42c of the control current circuit 14A (OTA 42A), and the control current Icnt is input to the input terminal 51a. The output terminal 51b is electrically connected to the input terminal 52a of the feedback current source 52, and supplies the control current Iaoccnt to the feedback current source 52. The output terminal 51c is electrically connected to the control terminal 53a of the variable resistance circuit 53, and supplies the control current Iagc1cnt to the variable resistance circuit 53. The power supply terminal 51d is electrically connected to a power supply wiring that supplies the power supply voltage VCC, and the power supply voltage VCC is supplied to the power supply terminal 51d.

The control circuit 51 includes transistors 61 to 69 and a current source 70. The transistors 61 and 69 are, for example, field effect transistors (FETs) having a MOS structure. In the example shown in FIG. 9, the transistors 61 to 63 are N-channel MOS (NMOS) transistors, and the transistors 64 to 69 are P-channel MOS (PMOS) transistors.

The transistors 61 to 63 constitute a current mirror circuit. Specifically, the transistor 61 functions as an input transistor of the current mirror circuit, and the transistors 62 and 63 function as output transistors of the current mirror circuit. Sources of the transistors 61 to 63 are electrically connected to the ground potential GND. A gate and a drain of the transistor 61 are electrically connected to each other and further electrically connected to the input terminal 51a. A gate of each of the transistors 62 and 63 is electrically connected to the gate and drain of the transistor 61. A drain of the transistor 62 is electrically connected to a drain and a gate of the transistor 64. A drain of the transistor 63 is electrically connected to a drain and a gate of the transistor 68 via a node N1.

Since the transistors 61 and 62 and the transistors 61 and 63 each constitute a current mirror circuit, for example, an output current (drain current) having a magnitude proportional to the magnitude of the drain current (control current Icnt) of the transistor 61 is output from each drain of the transistors 62 and 63. That is, when the input current (control current Icnt) is input to the input transistor (transistor 61), an output current having a magnitude proportional to the magnitude of the input current (control current Icnt) is output from the output transistor (transistors 62 and 63). Here, for convenience of explanation, the current mirror ratio is assumed to be input current:output current of transistor 62:output current of transistor 63=1:1:1. Thus, the control current Icnt input to the input terminal 51a is duplicated by the transistors 61 to 63, and the control current Icnt is output from each drain of the transistors 62 and 63. The duplicated two control currents Icnt flow from each drain of the transistors 62 and 63 toward each source of the transistors 62 and 63. In order to realize the above-described current mirror ratio, the transistors 61 to 63 may have the same electrical characteristics. The current mirror ratio may be appropriately changed according to a relationship between the control currents Iaoccnt and Iagc1cnt and the control current Icnt by, for example, making the sizes of the transistors 62 and 63 different from the size of the transistor 61.

The transistors 64 and 65 constitute a current mirror circuit. The transistor 64 functions as an input transistor of the current mirror circuit, and the transistor 65 functions as an output transistor of the current mirror circuit. Sources of the transistors 64 and 65 are electrically connected to the power supply terminal 51d via power supply wiring. The gate and drain of the transistor 64 are electrically connected to each other and further electrically connected to the drain of the transistor 62. A gate of the transistor 65 is electrically connected to the gate and drain of the transistor 64. A drain of the transistor 65 is electrically connected to the output terminal 51b.

The control current Icnt output from the drain of the transistor 62 is input to the drain of the transistor 64, and an output current (drain current) having a magnitude proportional to the magnitude of the drain current (control current Icnt) of the transistor 64 is output as the control current Iaoccnt from the drain of the transistor 65. That is, when the input current (control current Icnt) is input to the input transistor (transistor 64), an output current having a magnitude proportional to the magnitude of the input current (control current Icnt) is output from the output transistor (transistor 65). The actual input current flows from the source of the transistor 64 toward the drain of the transistor 64, and further flows into the drain of the transistor 62. With this configuration, the output current of the transistor 62 is equal to the input current of the transistor 64. In this case, the current mirror ratio of the current mirror circuit constituted by the transistors 64 and 65 is set to 1:α. That is, the control current Iaoccnt is a current (α×Icnt) having a magnitude obtained by amplifying the control current Icnt by α times. The control current Iaoccnt flows from the drain of the transistor 65 toward the output terminal 51b.

The transistors 66 and 67 constitute a current mirror circuit. The transistor 66 functions as an input transistor of the current mirror circuit, and the transistor 67 functions as an output transistor of the current mirror circuit. Sources of the transistors 66 and 67 are electrically connected to the power supply terminal 51d via power supply wiring. A gate and a drain of the transistor 66 are electrically connected to each other and further electrically connected to the current source 70. A gate of the transistor 67 is electrically connected to the gate and drain of the transistor 66. A drain of the transistor 67 is electrically connected to the drain and gate of the transistor 68 via the node N1.

The reference current Iref supplied from the current source 70 is input to the drain of the transistor 66, and an output current (drain current) having a magnitude proportional to the magnitude of the drain current (reference current Iref) of the transistor 66 is output as the offset current Iofs from the drain of the transistor 67. In this case, the current mirror ratio of the current mirror circuit constituted by the transistors 66 and 67 is set to 1:m. That is, the offset current Iofs is a current (m×Iref) having a magnitude obtained by amplifying the reference current Iref by in times. That is, when the input current (reference current Iref) is input to the input transistor 66, the output transistor 67 outputs an output current (reference current amplified in times). The offset current Iofs flows from the drain of the transistor 67 toward the node N1. The value of in is, for example, a real number larger than 1, and is arbitrarily selected according to the optical power at which the AGC is desired to be operated. Since the current value of the reference current Iref is a fixed value, the current value of the offset current Iofs (offset current value) is also a fixed value.

The transistors 68 and 69 constitute a current mirror circuit. The transistor 68 functions as an input transistor of the current mirror circuit, and the transistor 69 functions as an output transistor of the current mirror circuit. Sources of the transistors 68 and 69 are electrically connected to the power supply terminal 51*d* via power supply wiring. The gate and drain of the transistor 68 are electrically connected to each other, and further electrically connected to the drain of the transistor 63 and the drain of the transistor 67 via the node N1. A gate of the transistor 69 is electrically connected to the gate and drain of the transistor 68. A drain of the transistor 69 is electrically connected to the output terminal 51*c*.

The control current Icnt output from the drain of the transistor 63 is combined with the offset current Iofs output from the drain of the transistor 67 at the node N1. Specifically, the offset current Iofs is subtracted from the control current Icnt. At this time, a difference current (Icnt−Iofs) flows to the drain of the transistor 68 only when the current value of the control current Icnt is larger than the current value of the offset current Iofs, and the output current (drain current) having a magnitude proportional to the magnitude of the drain current (difference current) of the transistor 68 is output as the control current Iagc1cnt from the drain of the transistor 69. In this case, the current mirror ratio of the current mirror circuit constituted by the transistors 68 and 69 is set to 1:γ. That is, the control current Iagc1cnt is a current (γ×(Icnt−Iofs)) having a magnitude obtained by amplifying the difference current (Icnt−Iofs) by γ times. That is, when the input current (difference current (Icnt−Iofs)) is input to the input transistor 68, the output transistor 69 outputs the output current (difference current amplified by γ times). The control current Iagc1cnt flows from the drain of the transistor 69 toward the output terminal 51*c*.

On the other hand, when the current value of the control current Icnt is smaller than the current value of the offset current Iofs, no current flows to the transistor 68, so that the potential of the node N1 is pulled up with high resistance on the power supply voltage VCC side by the transistor 68 diode-connected. Since a drain-source voltage of the transistor 67 decreases, the transistors 66 and 67 do not operate as a current mirror circuit. At this time, the transistor 67 operates in a triode region (linear region), so that the potential of the node N1 is pulled up with low resistance on the power supply voltage VCC side. The triode region is, for example, a state in which a voltage value obtained by subtracting a threshold voltage from a gate-source voltage of the transistor is larger than the drain-source voltage.

Since the gate-source voltage is not applied to the transistor 68, a resistance value of the transistor 67 to which the gate-source voltage is applied is smaller than a resistance value of the transistor 68. As described above, the transistor 67 operates in the triode region, so that the transistor 67 cannot supply the offset current Iofs, and at the same time, the control current Icnt from the transistor 63 entirely flows through the transistor 67. As a result, the control current Iagc1cnt is output from the output terminal 51*c* only when the current value of the control current Icnt is larger than the current value of the offset current Iofs (in the region of Icnt−Iofs>0). For example, when the current value of the control current Icnt is smaller than the offset current Iofs, the gate-source voltage of the transistor 69 that is PMOS is almost 0 V, and the drain current (output current) of the transistor 69 is 0.

Although the input/output characteristic of FIG. 8 can be obtained by the control circuit 51 shown in FIG. 9, the above-described current mirror ratio can be appropriately changed. As the circuit configuration of the control circuit 51, another circuit configuration capable of obtaining the input/output characteristic of FIG. 8 may be adopted.

The feedback current source 52 is a current source for constituting an auto-offset control (AOC) circuit. The feedback current source 52 is a circuit that generates the DC bypass current Iaoc based on the control current Icnt. More specifically, the feedback current source 52 generates the DC bypass current Iaoc in accordance with the control current Iaoccnt. The feedback current source 52 has, for example, an input terminal 52*a*, an output terminal 52*b*, and a ground terminal 52*c*. The input terminal 52*a* is electrically connected to the output terminal 51*b* of the control circuit 51 and receives the control current Iaoccnt from the control circuit 51. The output terminal 52*b* is electrically connected to the input terminal 10*a* and outputs the DC bypass current Iaoc (specifically, draws the DC bypass current Iaoc into the feedback current source 52). The ground terminal 52*c* is electrically connected to the ground potential GND. The feedback current source 52 includes a field effect transistor 54 (first field effect transistor) and a field effect transistor 55 (second field effect transistor).

Each of the field effect transistors 54 and 55 is, for example, an N-channel MOS transistor. The size of the field effect transistor 54 and the size of the field effect transistor 55 may be the same as or different from each other. Sources (first source and second source) of the field effect transistors 54 and 55 are electrically connected to each other and also electrically connected to the ground potential GND via the ground terminal 52*c*. A drain (first drain) of the field effect transistor 54 is electrically connected to the output terminal 51*b* of the control circuit 51 via the input terminal 52*a* and receives the control current Iaoccnt from the control circuit 51. A gate (first gate) of the field effect transistor 54 is electrically connected to the drain of the field effect transistor 54. A drain (second drain) of the field effect transistor 55 is electrically connected to the input terminal 10*a* via the output terminal 52*b*. A gate (second gate) of the field effect transistor 55 is electrically connected to the drain and gate of the field effect transistor 54.

In the feedback current source 52 configured as above, the control current Iaoccnt flowing from the input terminal 52*a* flows to the field effect transistor 54 diode-connected, so that a gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that a gate-source voltage of the field effect transistor 55 is equal to the gate-source voltage Vgs1. Since the source of the field effect transistor 55 is electrically connected to the ground potential GND, the source potential is about 0 V. On the other hand, an input potential (for example, about 0.5 to 2 V) of the TIA unit 11 is applied to the drain of the field effect transistor 55. Accordingly, the field effect transistor 55 operates in the saturation region of the drain current-voltage characteristics. The saturation region is a state in which the voltage value obtained by subtracting the threshold voltage from the gate-source voltage of the transistor is smaller than the drain-source voltage. Even if the drain voltage of the field effect transistor 55 increases in the saturation region, a degree to which the drain current increases with respect to the increase of the drain voltage decreases as compared to the linear region. Accordingly, an impedance (output impedance) of the output terminal 52b has a relatively large value. For example, by setting the impedance value of the output terminal 52b to be larger than the input impedance value of the TIA unit 11, it is possible to prevent the AC component of the photocurrent Ipd from flowing into the feedback current source 52 while the DC bypass current Iaoc being drawn into the feedback current source 52.

That is, the field effect transistors 54 and 55 constitute a current mirror circuit. The control current Iaoccnt serves as an input current, and the DC bypass current Iaoc proportional to the control current Iaoccnt is output as an output current. In other words, the feedback current source 52 flows the DC bypass current Iaoc from the drain of the field effect transistor 55 to the source of the field effect transistor 55 in accordance with the control current Iaoccnt. As a result, the DC bypass current Iaoc is drawn from the photocurrent Ipd. As a result, the DC component and a low frequency component are removed from the difference ΔVtia, and a potential (average potential) of the voltage signal Vtia is aligned with a potential of the reference voltage signal Vref (DC offset control). Consequently, the difference between the time-average value of the voltage of the positive phase signal Vout and the time-average value of the voltage of the negative phase signal Voutb is reduced.

The variable resistance circuit 53 is a circuit that generates the AC bypass current Iagc1 based on the control current Icnt. More specifically, the variable resistance circuit 53 generates the AC bypass current Iagc1 in accordance with the control current Iagc1cnt. The variable resistance circuit 53 has, for example, a control terminal 53a, a resistance terminal 53b, and a resistance terminal 53c. The control terminal 53a is electrically connected to the output terminal 51c of the control circuit 51 and receives the control current Iagc1cnt from the control circuit 51. The resistance terminal 53b is electrically connected to the input terminal 10a. The resistance terminal 53c is electrically connected to an output terminal of the reference voltage generation circuit 12 (voltage amplifier 12a) and receives the reference voltage signal Vref from the reference voltage generation circuit 12. The variable resistance circuit 53 includes a field effect transistor 56 (third field effect transistor) and a field effect transistor 57 (fourth field effect transistor).

Each of the field effect transistors 56 and 57 is, for example, an N-channel MOS transistor. The size of the field effect transistor 56 and the size of the field effect transistor 57 may be the same as or different from each other. Sources (third source and fourth source) of the field effect transistors 56 and 57 are electrically connected to each other and also electrically connected to the output terminal of the reference voltage generation circuit 12 (voltage amplifier 12a) via the resistance terminal 53c. The reference voltage signal Vref is input (supplied) to the sources of the field effect transistors 56 and 57. A drain (third drain) of the field effect transistor 56 is electrically connected to the output terminal 51c of the control circuit 51 via the control terminal 53a and receives the control current Iagc1cnt from the control circuit 51. A gate (third gate) of the field effect transistor 56 is electrically connected to the drain of the field effect transistor 56. A drain (fourth drain) of the field effect transistor 57 is electrically connected to the input terminal 10a via the resistance terminal 53b. A gate (fourth gate) of the field effect transistor 57 is electrically connected to the drain and gate of the field effect transistor 56.

In the variable resistance circuit 53 configured as above, the control current Iagc1cnt flowing from the control terminal 53a flows to the field effect transistor 56 diode-connected, so that a gate-source voltage Vgs2 is generated between the gate and source of the field effect transistor 56. The gate of the field effect transistor 56 and the gate of the field effect transistor 57 are electrically connected to each other, and the source of the field effect transistor 56 and the source of the field effect transistor 57 are electrically connected to each other, so that a gate-source voltage of the field effect transistor 57 is equal to the gate-source voltage Vgs2. The reference voltage signal Vref is supplied to the source of the field effect transistor 57, and the input potential of the TIA unit 11 is applied to the drain of the field effect transistor 57. Since the reference voltage signal Vref has substantially the same potential as the input potential of the TIA unit 11, the field effect transistor 57 operates in a deep triode region (linear region). The deep triode region is a state in which the voltage value obtained by subtracting the threshold voltage from the gate-source voltage of the transistor is much larger than the drain-source voltage. When the drain voltage of the field effect transistor 57 increases in the linear region, the drain current increases accordingly. Especially when the drain voltage is relatively small, the drain current can be considered changed (linearly) in proportion to the drain voltage. A ratio of the drain voltage to the drain current of the field effect transistor 57 will be expressed as the resistance value $R_{AGC1}$. The resistance value $R_{AGC1}$ will be described later.

A drain current Id (that is, the AC bypass current Iagc1) of the field effect transistor 57 biased in the triode region can be represented by Formula (2) by using an intrinsic gain (gain coefficient) β of the field effect transistor 57 and a threshold voltage Vth of the field effect transistor 57. The intrinsic gain β is a value depending on the semiconductor process and size of the field effect transistor 57.

[Formula 2]

$$Iagc1 = Id = \frac{\beta}{2} \times \{2 \times (Vgs2 - Vth) \times Vds - Vds^2\} \tag{2}$$

In the triode region, when a potential difference between the drain and the source is small, a magnitude relationship between the drain potential and the source potential may be reversed. In this case, a terminal having the lowest voltage with respect to the gate functions as the source. Since a circuit symbol of the transistor is used for convenience in expressing a circuit, a terminal notation of the transistor in the circuit diagram may not match the actual operation of the transistor. In this case, the terminals are appropriately replaced so that the drain-source voltage Vds is 0 or more, and the terminal having a low potential is always regarded as the source.

As shown in Formula (3), the gate-source voltage Vgs2 is expressed by adding the drain-source voltage Vds to the gate-source voltage Vgs0. The gate-source voltage Vgs0 is the gate-source voltage when the drain-source voltage Vds is 0 V.

[Formula 3]

$$Vgs2 = Vgs0 + Vds \tag{3}$$

Formula (4) is obtained by substituting Formula (3) into Formula (2). As shown in Formula (4), the drain current Id (AC bypass current Iagc1) is proportional to a square of the drain-source voltage Vds, and thus includes a non-linear component.

[Formula 4]

$$Iagc1 = Id = \frac{\beta}{2} \times \{2 \times (Vgs0 + Vds - Vth) \times Vds - Vds^2\} = \quad (4)$$

$$\beta \times Vds \times \left\{(Vgs0 - Vth) + \frac{Vds}{2}\right\}$$

As shown in Formula (5), a differential resistance value Rd (resistance value $R_{AGC1}$) is obtained by differentiating Formula (4) by the drain-source voltage Vds and calculating a reciprocal of the calculation result. As shown in Formula (5), the resistance value $R_{AGC1}$ changes according to the drain-source voltage Vds. That is, the resistance value $R_{AGC1}$ decreases as the gate-source voltage Vgs2 (=Vgs0+Vds) increases. Since the drain potential is modulated according to the photocurrent Ipd, the resistance value $R_{AGC1}$ varies non-linearly.

[Formula 5]

$$R_{AGC1} = Rd = \frac{1}{\frac{\partial Id}{\partial Vds}} = \frac{1}{\beta \times (Vgs0 - Vth + Vds)} \quad (5)$$

As shown in Formula (6), a transconductance gin in the triode region is obtained by differentiating Formula (4) by the gate-source voltage Vgs0. In the triode region, the drain-source voltage Vds is smaller than a voltage obtained by subtracting the threshold voltage Vth from the gate-source voltage Vgs2. In particular, in the deep triode region, the drain-source voltage Vds is much smaller than the voltage obtained by subtracting the threshold voltage Vth from the gate-source voltage Vgs2, so that the transconductance gin in the triode region becomes negligibly small as compared with a transconductance ($\beta \times$(Vgs–Vth)) in saturation operation.

[Formula 6]

$$gm = \frac{\partial Id}{\partial Vgs0} = \beta \times Vds \quad (6)$$

That is, although the variable resistance circuit 53 has the same circuit configuration as the feedback current source 52, the variable resistance circuit 53 does not operate as a current mirror circuit, and the field effect transistor 57 operates as a variable resistor controlled by the gate-source voltage Vgs2. That is, the reference voltage generation circuit 12 grounds the field effect transistor 57 in an alternating current manner and the field effect transistor 57 is biased in the deep triode region. Since a potential of the resistance terminal 53b and a potential of the resistance terminal 53c are substantially the same, the DC component of the photocurrent Ipd hardly flows to the variable resistance circuit 53, and the AC component of the photocurrent Ipd partially flows as the AC bypass current Iagc1 into the variable resistance circuit 53 (field effect transistor 57). In other words, the variable resistance circuit 53 flows the AC bypass current Iagc1 between the drain and source of the field effect transistor 57 in accordance with the control current Iagc1cnt. Since the AC bypass current Iagc1 is an AC component, the AC bypass current Iagc1 may flow from the drain of the field effect transistor 57 to the source of the field effect transistor 57 according to the photocurrent Ipd or may flow from the source of the field effect transistor 57 to the drain of the field effect transistor 57 according to the photocurrent Ipd. The AC bypass current Iagc1 is also determined depending on the magnitude of the resistance value $R_{AGC1}$ of the field effect transistor 57 with respect to the magnitude of the input impedance of the TIA unit 11. When the resistance value $R_{AGC1}$ of the field effect transistor 57 is made smaller than the input impedance of the TIA unit 11, the AC bypass current Iagc1 increases. At this time, the DC component of the photocurrent Ipd can be prevented from flowing into the variable resistance circuit 53 by suppressing the drain-source voltage Vds of the field effect transistor 57 to be small.

That is, the photocurrent Ipd increases, the difference ΔVtia increases, and when the control current Icnt exceeds the current value of the offset current Iofs, the control current Iagc1cnt is supplied to the variable resistance circuit 53. As a result, the gate-source voltage Vgs2 is generated in the field effect transistors 56 and 57. As the gate-source voltage Vgs2 increases, the resistance value $R_{AGC1}$ of the field effect transistor 57 decreases, so that the signal component (AC component) of the photocurrent Ipd excluding the DC component is partially drawn as the AC bypass current Iagc1 from the photocurrent Ipd. As a result, a possibility that the TIA unit 11 will be saturated by a large signal input is reduced. More specifically, when the gain (transimpedance) of the TIA unit 11 is set to a substantially constant value, the photocurrent Ipd increases, and when the amplitude of the current signal Iin increases to a predetermined value or more, an amplitude of the voltage signal Vtia is saturated. Thus, gain control is performed such that saturation of the amplitude of the voltage signal Vtia is suppressed by drawing the AC bypass current Iagc1 from the photocurrent Ipd. When a burst optical signal is input as the optical signal Pin, the intensity of the optical signal Pin changes significantly before and after a no-signal interval between two burst signals, so that the AGC automatically adjusts the magnitude of the AC bypass current Iagc1 according to the magnitude of the voltage signal Vtia (actually, the magnitude of the difference ΔVtia between the voltage signal Vtia and the reference voltage signal Vref). Although the AGC adjusts the magnitude of the signal component (AC component) of the current signal Iin, it is preferable that the DC component of the current signal tin and control (DC offset control) of the DC component be not affected at that time.

As described above, a current proportional to the drain-source voltage flows between the drain and source of the field effect transistor 57 biased in the deep triode region (linear region). Since the reference voltage signal Vref has substantially the same potential as the input potential of the TIA unit 11, no DC current flows, and the AC bypass current Iagc1 does not disturb the DC offset control. The change in the resistance value $R_{AGC1}$ of the field effect transistor 57 does not affect the AOC control and may affect only the gain control.

Next, frequency characteristics of the control loop in the transimpedance amplifier circuit 10A will be described. An approximate expression of a transfer function of the control loop in the transimpedance amplifier circuit 10A is represented by Formula (7) using an open loop gain $A_{TIA}$ of the voltage amplifier 11a of the TIA unit 11, an input impedance $R_{IN}$ of the TIA unit 11, a gain F(s) of the entire feedback circuit, and the resistance value $R_{AGC1}$ of the field effect transistor 57. The gain F(s) is a product of a voltage gain of the integrating circuit 41A, the transconductance of the OTA 42A, a gain of the control circuit 51, and a gain of the feedback current source 52 (field effect transistor 55). The gain F(s) has frequency dependence as the integrating circuit 41A at low frequencies. The open loop gain $A_{TIA}$ and the input impedance $R_{IN}$ are constant (have fixed values) at low frequencies regardless of frequency.

[Formula 7]

$$\Delta Vtia(s) = \frac{A_{TIA} \times \frac{R_{IN} \times R_{AGC1}}{R_{IN} + R_{AGC1}}}{1 + A_{TIA} \times F(s) \times \frac{R_{IN} \times R_{AGC1}}{R_{IN} + R_{AGC1}}} \times \Delta Ipd(s) \quad (7)$$

Since the resistance value $R_{AGC1}$ is controlled by the same control loop, the frequency characteristics of the control loop are not strictly the same as Formula (7). Since the drain-source voltage of the field effect transistor 57 is set to be approximately 0 V, the transconductance of the field effect transistor 57 biased in the deep triode region is negligibly small compared to the transconductance of the field effect transistor 55. Therefore, there is almost no control gain in the field effect transistor 57, so that the influence of the control gain of the field effect transistor 57 on the control is extremely small. On the other hand, the resistance value $R_{AGC1}$ of the field effect transistor 57 is controlled by the gate-source voltage Vgs2 and constitutes a parallel resistance circuit with the input impedance $R_{IN}$, so that the resistance value $R_{AGC1}$ may greatly affect the photocurrent Ipd and the DC bypass current Iaoc. As a result, the simplified Formula (7) is obtained.

As described above, according to a polarity of the difference ΔVin, the OTA 42A can flow the control current Icnt in the drawing direction or the discharging direction. As shown in FIG. 6, the transconductance of the OTA 42A becomes constant when the difference ΔVin is near 0 V. On the other hand, since the control circuit 51 and the feedback current source 52 copy the current by using the current mirror circuit, the output currents of the control circuit 51 and the feedback current source 52 are rectified in one direction by the diode-connected MOS transistor constituting the current mirror circuit. Due to this rectification, the transconductance is reduced in a region where the output current is very small; however, in the other regions, the current is accurately copied by a transistor size ratio. Therefore, in the control circuit 51 and the feedback current source 52, the transconductance is constant with respect to the input current, except for the region where the output current is very small.

If the DC bypass current Iaoc is generated not by the current mirror circuit but by controlling a gate potential of a source-grounded amplifier, the transconductance changes in proportion to a square root of the drain current. Since the DC bypass current Iaoc requires a dynamic range of at least about 60 dB (1 μA to 1 mA), the change in transconductance is 30 dB. As a result, a loop transfer function (also referred to as "loop transfer gain") changes significantly with respect to the feedback current. In a configuration in which the AC component is drawn from the photocurrent Ipd by voltage-controlling the cathode of the diode, a resistance component of the diode changes non-linearly with respect to the control voltage, so that input level dependency of the loop transfer gain of the control loop increases.

On the other hand, in the transimpedance amplifier circuit 10A, in a state in which the photocurrent Ipd is small and only the AOC is operating, the OTA 42A operates linearly, so that except for a region where the DC bypass current Iaoc is very small, the loop transfer function is constant regardless of the DC bypass current Iaoc. The transconductance of the OTA 42A is designed to increase when the control current Icnt exceeds the current value of the offset current Iofs due to the increase of the photocurrent Ipd. When the control current Icnt exceeds the current value of the offset current Iofs, the AGC operates, and the resistance value $R_{AGC1}$ of the field effect transistor 57 decreases; however, the transconductance of the OTA 42A increases. As a result, the reduction of the loop transfer gain (that is, the increase of the control time constant) is suppressed.

As described above, the loop transfer gain of the control loop is controlled to be substantially constant except for the region where the photocurrent Ipd is very small, so that the time constant of the control loop is substantially constant regardless of the photocurrent Ipd. The above-described operation is suitable when it is necessary to immediately control the DC offset and the gain, such as when the burst optical signal is input as the optical signal Pin to the optical receiving device 1A.

Figure 10:
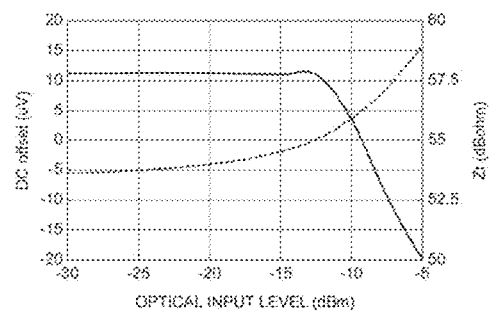
FIG. 10 is a diagram showing DC offset characteristics and gain characteristics in the transimpedance amplifier circuit shown in FIG. 1.

Next, the function and effect of the transimpedance amplifier circuit 10A will be described. FIG. 10 is a diagram showing DC offset characteristics and gain characteristics in the transimpedance amplifier circuit shown in FIG. 1. The horizontal axis of FIG. 10 represents an optical input level (unit: dBm) of the optical signal Pin. The vertical axis of FIG. 10 represents a DC offset amount (unit: μV) and a transimpedance gain Zt (unit: dBohm). The broken line shown in FIG. 10 indicates the DC offset characteristics. The DC offset characteristics show dependency of the DC offset amount on the optical input level of the optical signal Pin. The solid line in FIG. 10 indicates the gain characteristics. The gain characteristics show dependency of the transimpedance gain Zt of the transimpedance amplifier circuit 10A on the optical input level of the optical signal Pin.

As described above, when the current is drawn from the photocurrent Ipd, the transimpedance amplifier circuit 10A can control the DC component (DC bypass current Iaoc) and the AC component (AC bypass current Iagc1) independently. Thus, for small signals of −30 dBm to −15 dBm, it is not necessary to draw the AC component from the photocurrent Ipd. Therefore, in the small signal, only the DC bypass current Iaoc is drawn from the photocurrent Ipd, so that only the DC offset is controlled.

When the optical input level of the signal exceeds −15 dBm, the control current Iagc1cnt starts to flow in the variable resistance circuit 53, and the resistance value $R_{AGC1}$ of the field effect transistor 57 decreases. As a result, the AC bypass current Iagc1 is drawn from the photocurrent Ipd, and the transimpedance gain Zt of the transimpedance amplifier circuit 10A starts to decrease. As the transimpedance gain Zt decreases, the loop transfer gain of the control loop decreases, so that an amount of DC offset suppression decreases slightly. However, since the amount of suppression is approximately the amount expressed in the unit of μV, an amount of DC offset variation is negligibly small with respect to signal amplitude. Therefore, in a wide range of the optical input level, distortion due to saturation of the transimpedance amplifier circuit 10A is suppressed, and stable reception characteristics can be obtained.

In the transimpedance amplifier circuit 10A, a single control loop (the single integrating circuit 41A and the single control circuit 51) can realize the DC offset control and the gain control, so that an increase of the circuit scale can be suppressed. Furthermore, the optical input level can be arbitrarily controlled by adjusting a response of the control circuit 51 (amplification factor α, amplification factor γ, current value of offset current Iofs, etc.).

In the transimpedance amplifier circuit 10A, the control gain that decreases with the AGC is compensated by the OTA 42A. This makes it possible to reduce the variation of the control time constant due to the magnitude of the photocurrent Ipd. This operation is particularly suitable when the burst optical signal is input as the optical signal Pin.

Figure 11A:
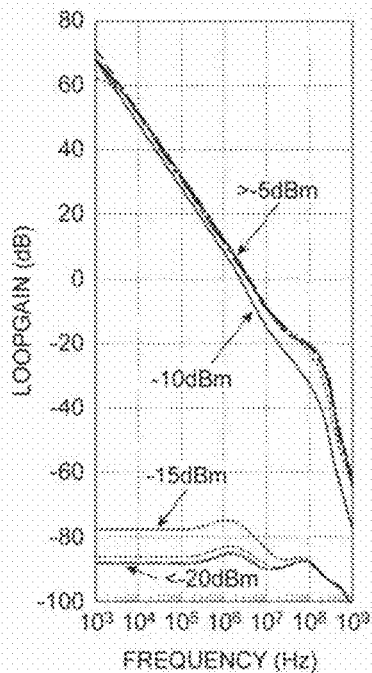
FIG. 11A is a diagram showing a loop transfer function of a control loop in the transimpedance amplifier circuit shown in FIG. 1.
Figure 11B:
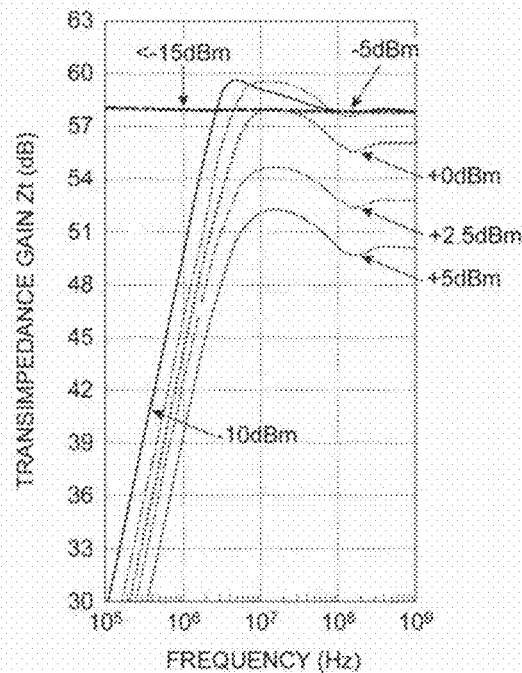
FIG. 11B is a diagram showing closed loop frequency characteristics in the transimpedance amplifier circuit shown in FIG. 1.
Figure 12A:
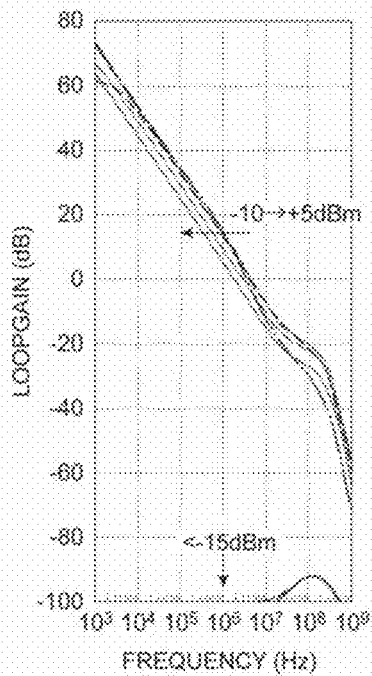
FIG. 12A is a diagram showing a loop transfer function of a control loop in a transimpedance amplifier circuit of a first comparative example.
Figure 12B:
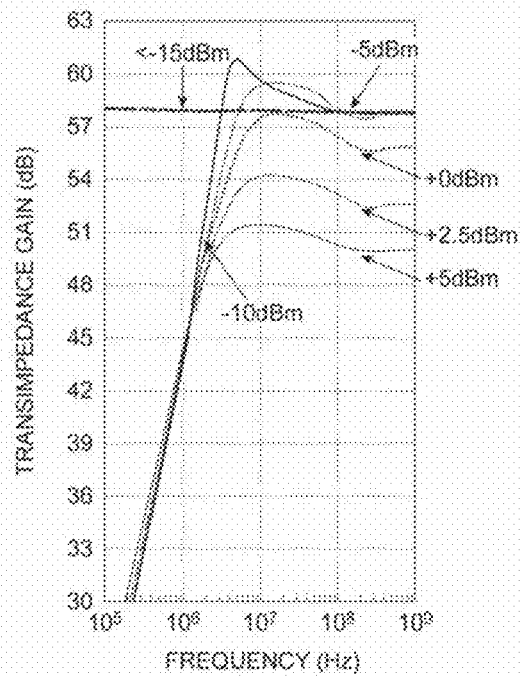
FIG. 12B is a diagram showing closed loop frequency characteristics in the transimpedance amplifier circuit of the first comparative example.

FIG. 11A is a diagram showing a loop transfer function of a control loop in the transimpedance amplifier circuit shown in FIG. 1. FIG. 11B is a diagram showing closed loop frequency characteristics in the transimpedance amplifier circuit shown in FIG. 1. FIG. 12A is a diagram showing a loop transfer function of a control loop in a transimpedance amplifier circuit of a first comparative example. FIG. 12B is a diagram showing closed loop frequency characteristics in the transimpedance amplifier circuit of the first comparative example. The transimpedance amplifier circuit of the first comparative example mainly differs from the transimpedance amplifier circuit 10A (first example) in that an OTA operating linearly is included instead of the OTA 42A. That is, the transimpedance amplifier circuit of the first comparative example has a configuration in which the transconductance gm2 of the transconductance circuit 22 of the OTA 42A is 0. The horizontal axes of FIGS. 11A, 11B, 12A, and 12B represent the frequency (unit: Hz) of the photocurrent Ipd. The vertical axes of FIGS. 11A and 12A represent the loop transfer gain (unit: dB). The vertical axes of FIGS. 11B and 12B represent the transimpedance gain (unit: dB).

As shown in FIG. 11A, in the transimpedance amplifier circuit 10A, except when the optical input level of the optical signal Pin is weak (when the optical input level is −10 dBm or more), the frequency at which the loop transfer gain becomes 0 is substantially constant. As a result, as shown in FIG. 11B, a closed loop transfer function (transimpedance gain) decreases as the variable resistance circuit 53 operates due to an increase of the photocurrent Ipd; however, low cutoff frequency does not change. As shown in FIG. 12A, in the transimpedance amplifier circuit of the first comparative example, the frequency at which the loop transfer gain becomes 0 depends on the optical input level of the optical signal Pin. As a result, as shown in FIG. 12B, the closed loop transfer function (transimpedance gain) decreases as the photocurrent Ipd increases, and the low cutoff frequency also decreases (the time constant increases).

Figure 14:
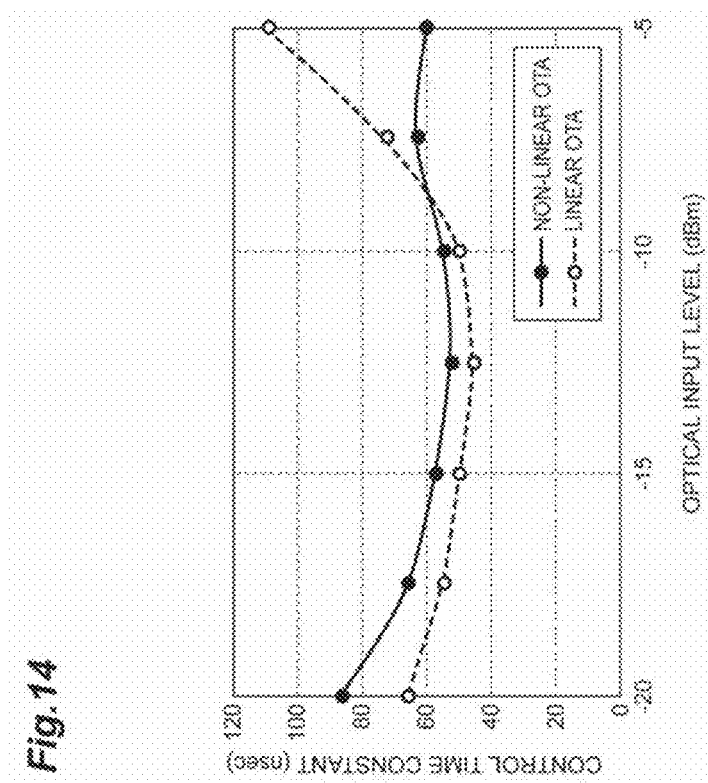
FIG. 14 is a diagram showing a change in control time constant with respect to the optical input level.
Figure 13:
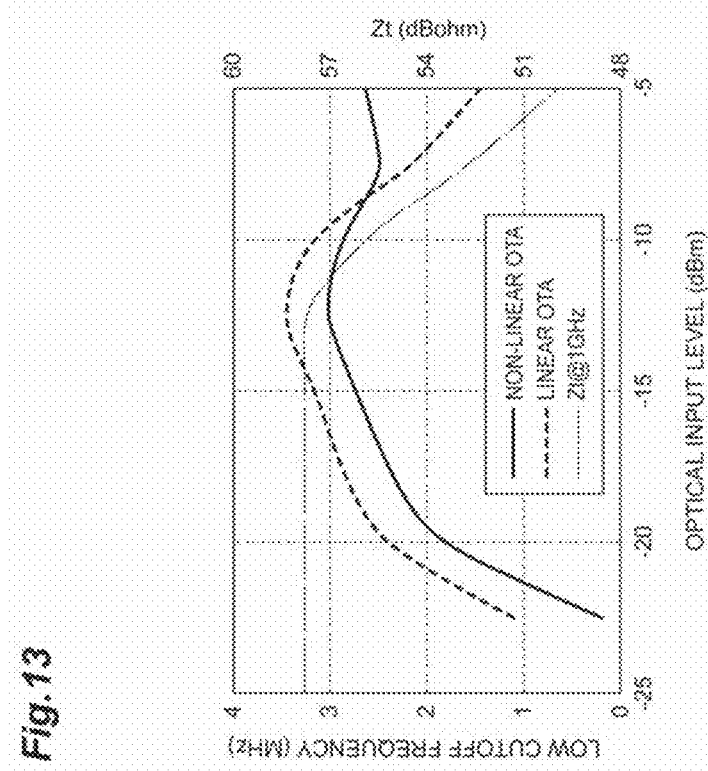
FIG. 13 is a diagram showing a change in transimpedance gain and a change in low cutoff frequency with respect to an optical input level.

FIG. 13 is a diagram showing a change in transimpedance gain and a change in low cutoff frequency with respect to an optical input level. FIG. 14 is a diagram showing a change in control time constant with respect to the optical input level. The horizontal axes of FIGS. 13 and 14 represent the optical input level (unit: dBm) of the optical signal Pin. The vertical axis of FIG. 13 represents the low cutoff frequency (unit: MHz) and the transimpedance gain Zt (unit: dBohm). The vertical axis of FIG. 14 represents the control time constant (unit: nsec). The solid line in FIG. 13 indicates the low cutoff frequency of the transimpedance amplifier circuit 10A (non-linear OTA). The broken line in FIG. 13 indicates the low cutoff frequency of the transimpedance amplifier circuit (linear OTA) of the first comparative example. The alternate long and short dash line in FIG. 13 indicates the transimpedance gain of the transimpedance amplifier circuit 10A (non-linear OTA). The solid line in FIG. 14 indicates the control time constant of the transimpedance amplifier circuit 10A (non-linear OTA). The broken line in FIG. 14 indicates the control time constant of the transimpedance amplifier circuit (linear OTA) of the first comparative example. Control characteristics of the transimpedance gain with respect to the optical input level in the first comparative example are the same as those of the transimpedance amplifier circuit 10A (non-linear OTA), and are thus not shown.

As shown in FIG. 13, in the transimpedance amplifier circuit of the first comparative example, as the optical input level of the optical signal Pin increases, the transimpedance gain Zt decreases, and the low cutoff frequency also decreases. Specifically, in response to the transimpedance gain Zt falling from a peak value (about 58 dBohm) by 8 dB (⅖), the low cutoff frequency also falls from the peak value to about ⅖. On the other hand, in the transimpedance amplifier circuit 10A, even when the transimpedance gain Zt decreases with the increase of the optical input level of the optical signal Pin, the decrease of the low cutoff frequency is suppressed.

As shown in FIG. 14, in the transimpedance amplifier circuit of the first comparative example, the control time constant increases (becomes slower) as the optical input level of the optical signal Pin increases. On the other hand, in the transimpedance amplifier circuit 10A, even when the optical input level of the optical signal Pin increases, the increase of the control time constant is suppressed. That is, the control time constant is prevented from depending on the optical input level of the optical signal Pin, and the variation of the control time constant is suppressed in a wide range of optical input levels. This operation is suitable for receiving the burst optical signal.

Figure 15:
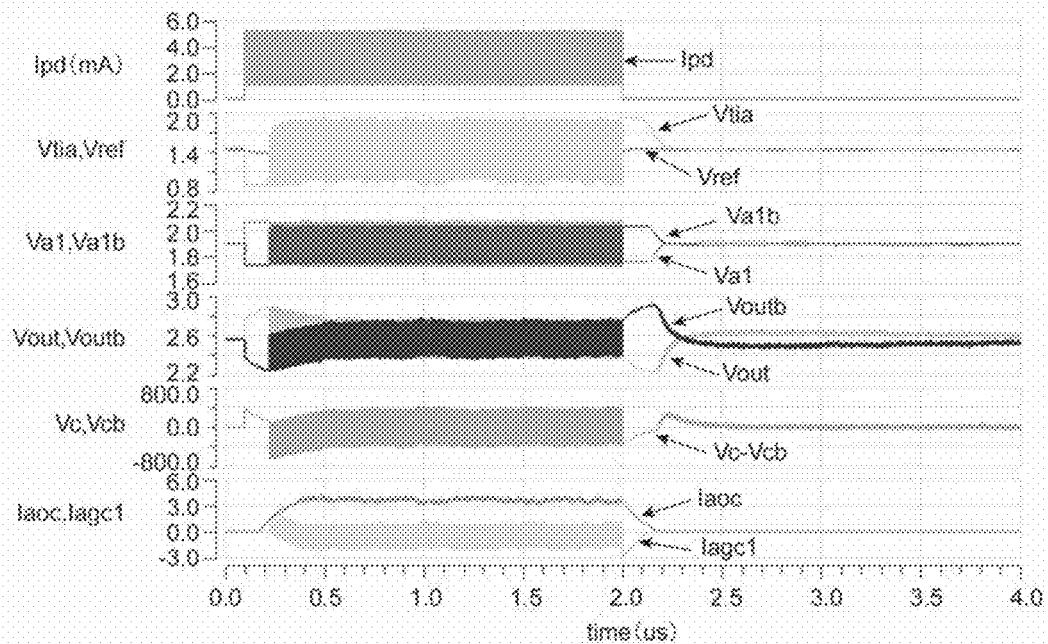
FIG. 15 is a diagram showing a response of each node in the optical receiving device shown in FIG. 1.

FIG. 15 is a diagram showing a response of each node in the optical receiving device shown in FIG. 1. In this case, a response is shown when the optical receiving device 1A receives a burst optical signal as the optical signal Pin. It is assumed that when the burst optical signal starts at time t of 100 nsec, the optical signal Pin has increased from a no-input state to −5 dBm, and when the burst optical signal ends at the time t of 2 μsec, the optical signal Pin has decreased from −5 dBm to −26 dBm. As shown in FIG. 15, since the control time constant is substantially constant except when the burst optical signal is a small signal, the DC component and the AC component are drawn from the photocurrent Ipd with respect to the change in the burst optical signal, and the state is converged to a stable state in several hundreds nsec. At the input of the signal processing circuit 20, the DC offset is removed in approximately 400 nsec from the start and end of the burst optical signal. This operation is suitable for receiving the burst optical signal.

As described above, in the transimpedance amplifier circuit 10A, the feedback current source 52 generates the DC bypass current Iaoc, the variable resistance circuit 53 generates the AC bypass current Iagc1, and the DC bypass current Iaoc and the AC bypass current Iagc1 are drawn from the photocurrent Ipd generated by the photodetector PD, so that the current signal Iin is generated. Then, the TIA unit 11 converts the current signal Iin into the voltage signal Vtia, and the differential amplifier circuit 13A generates the differential voltage signal Vout,Voutb in accordance with the difference ΔVtia between the voltage signal Vtia and the reference voltage signal Vref.

The control current Icnt is generated based on the integrated value of the difference ΔVtia, and the feedback current source 52 is controlled so that the DC bypass current Iaoc increases as the control current Icnt increases. Therefore, the DC component of the photocurrent Ipd is drawn as the DC bypass current Iaoc from the photocurrent Ipd, whereby the DC component is removed from the photocurrent Ipd. On the other hand, when the control current Icnt exceeds the current value of the offset current Iofs, the variable resistance circuit 53 is controlled so that the AC bypass current Iagc1 increases as the control current Icnt increases. Thus, when the photocurrent Ipd is relatively small, although the DC component of the photocurrent Ipd is drawn as the DC bypass current Iaoc, the drawing of the AC bypass current Iagc1 is suppressed. Therefore, attenuation of the AC component of the photocurrent Ipd can be avoided while removing the DC component of the photocurrent Ipd. When the photocurrent Ipd is relatively large, the DC component of the photocurrent Ipd is drawn as the DC bypass current Iaoc, and the AC component of the photocurrent Ipd is drawn as the AC bypass current Iagc1 from the photocurrent Ipd. Therefore, the AC component of the photocurrent Ipd can be attenuated while removing the DC component of the photocurrent Ipd. Since the feedback current source 52 and the variable resistance circuit 53 are both controlled by one control circuit 51, control of DC component removal (DC offset control) and gain control can be performed with a single control loop. As a result, it is possible to perform the DC offset control and the gain control while suppressing the circuit scale.

The voltage signal Vinp and the voltage signal Vinn are generated by integrating the difference $\Delta$Vtia. When the difference $\Delta$Vin obtained by subtracting the voltage signal Vinn from the voltage signal Vinp is smaller than the threshold value Vth1, the control current Icnt is generated using the transconductance (gm1−gm2) in accordance with the voltage signal Vinp and the voltage signal Vinn. When the difference $\Delta$Vin is larger than the threshold value Vth2, the control current Icnt is generated using the transconductance gm1 in accordance with the voltage signal Vinp and the voltage signal Vinn. Until the control current Icnt exceeds the current value of the offset current Iofs, the AC bypass current Iagc1 is not drawn, so that the resistance value $R_{AGC1}$ of the variable resistance circuit 53 (field effect transistor 57) does not change. On the other hand, when the control current Icnt exceeds the current value of the offset current Iofs, the variable resistance circuit 53 is controlled so that the AC bypass current Iagc1 increases as the control current Icnt increases. Therefore, the resistance value $R_{AGC1}$ of the variable resistance circuit 53 (field effect transistor 57) decreases. In the control current circuit 14A, when the difference $\Delta$Vin becomes larger than the threshold value Vth1, a transconductance larger than the transconductance (gm1−gm2) is used. As described above, a decrease of the loop transfer gain due to the decrease of the resistance value $R_{AGC1}$ can be compensated for by the increase of the transconductance of the control current circuit 14A. As a result, it is possible to suppress the increase of the control time constant of feedback control. As a result, it becomes possible to suppress the variation of the control time constant due to a change in signal intensity of the burst optical signal.

The transconductance circuit 21 operates such that in the range VR1 of the difference $\Delta$Vin, the output current Iout1 decreases as the difference $\Delta$Vin increases. The transconductance circuit 22 operates such that in the range VR2 of the difference $\Delta$Vin, the output current Iout2 increases as the difference $\Delta$Vin increases. The control current Icnt is generated by adding the output current Iout1 and the output current Iout2. Since the upper limit value of the range VR2 is smaller than the upper limit value of the range VR1, it is possible to realize the input/output characteristic of the OTA 42A that the transconductance increases as the difference $\Delta$Vin increases when the difference $\Delta$Vin is a positive value. Thus, the generation of the control current Icnt can be simplified.

Ideally, it is desirable that the potential of the voltage signal Vtia and the potential of the reference voltage signal Vref match in the absence of the optical signal Pin. However, due to variations in the characteristics of the TIA unit 11, variations in the characteristics between the TIA unit 11 and the reference voltage generation circuit 12, external noise, etc., the potential of the voltage signal Vtia and the potential of the reference voltage signal Vref in the absence of the optical signal Pin may be different from each other. Thus, the potential of the voltage signal Vtia may become higher than the potential of the reference voltage signal Vref in the absence of the optical signal Pin. Since the increase/decrease of the voltage signal Vtia is inverted with respect to the increase/decrease of the current signal Iin, the state in which the potential of the voltage signal Vtia is higher than the potential of the reference voltage signal Vref means the state in which the current signal Iin decreases. Since the feedback current source 52 flows the DC bypass current Iaoc in the direction of drawing from the photocurrent Ipd, for example, when the voltage signal Vtia is larger than the reference voltage signal Vref, the difference $\Delta$Vtia cannot approach 0. In this case, since the difference $\Delta$Vtia is a negative value, the difference $\Delta$Vin is also a negative value, resulting in open loop control. As a result, there is no control gain, so that the control time constant is delayed. Then, even if the optical signal Pin is input, the control time constant is slow, so that the control loop cannot respond immediately.

On the other hand, the anode of the diode 48 is electrically connected to the output terminal 41c, and the cathode of the diode 48 is electrically connected to the output terminal 41d. Therefore, when the difference $\Delta$Vtia is a negative value, it is possible to prevent the absolute value of the difference $\Delta$Vtia from becoming larger than the on-voltage of the diode 48. As a result, a recovery time from the open loop control to closed loop control can be shortened. Thus, even when the optical signal Pin is input in a burst manner, the DC offset control and the gain control can be performed immediately. That is, it becomes possible to shorten a response time when the burst optical signal is input.

In the feedback current source 52, the field effect transistor 54 is diode-connected, so that when the drain of the field effect transistor 54 receives the control current Iaoccnt, the gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that the gate-source voltage of the field effect transistor 55 is equal to the gate-source voltage Vgs1. The source of the field effect transistor 55 is electrically connected to the source of the field effect transistor 54, that is, the ground potential GND, and the drain of the field effect transistor 55 is electrically connected to the input terminal 10a, so that a potential difference between the source and drain of the field effect transistor 55 increases. As a result, the field effect transistor 55 operates in the saturation region. Thus, the field effect transistor 55 functions as a current source, and an output impedance of the drain of the field effect transistor 55 increases. Thus, although the AC component of the photocurrent Ipd hardly flows into the field effect transistor 55, the DC component of the photocurrent Ipd may flow as the DC bypass current Iaoc into the field effect transistor 55. Then, as the control current Icnt increases, the gate-source voltage Vgs1 of the field effect transistor 54 increases, so that the drain current of the field effect transistor 55 increases accordingly. As a result, the DC component of the photocurrent Ipd is drawn as the DC bypass current Iaoc from the photocurrent Ipd, and the DC component is suitably removed from the photocurrent Ipd. The magnitude of the output impedance of the output terminal 52b may be determined in consideration of the input impedance Zin of the TIA unit 11. For example, when the input impedance of the TIA unit 11 is Zin, the output impedance of the output terminal 52b may be set to 100×Zin or more. Since the input impedance Zin and the output impedance of the output terminal 52b can have different frequency characteristics from each other, it is sufficient that such a relationship is satisfied at least in a predetermined frequency range (band).

In the variable resistance circuit 53, the field effect transistor 56 is diode-connected, so that when the drain of the field effect transistor 56 receives the control current Iagc1cnt, the gate-source voltage Vgs2 is generated between the gate and source of the field effect transistor 56. The gate of the field effect transistor 56 and the gate of the field effect transistor 57 are electrically connected to each other, and the source of the field effect transistor 56 and the source of the field effect transistor 57 are electrically connected to each other. Therefore, the gate-source voltage of the field effect transistor 57 is equal to the gate-source voltage Vgs2. The reference voltage signal Vref is supplied to the source of the field effect transistor 57, and the drain of the field effect transistor 57 is electrically connected to the input terminal 10a, so that there is almost no potential difference between the drain and source of the field effect transistor 57. As a result, the field effect transistor 57 operates in the (deep) triode region. Thus, the field effect transistor 57 functions as a variable resistor, and an output impedance of the drain of the field effect transistor 57 decreases. Since there is almost no potential difference between the drain and source of the field effect transistor 57, although the DC component of the photocurrent Ipd hardly flows into the field effect transistor 57, the AC component of the photocurrent Ipd may flow as the AC bypass current Iagc1 into the field effect transistor 57. Then, when the control current Icnt exceeds the current value of the offset current Iofs, the gate-source voltage Vgs2 of the field effect transistor 56 increases as the control current Icnt increases. Therefore, when the photocurrent Ipd is relatively small, the drawing of the AC bypass current Iagc1 is suppressed, so that the attenuation of the AC component can be avoided. When the photocurrent Ipd is relatively large, the AC component of the photocurrent Ipd is drawn as the AC bypass current Iagc1 from the photocurrent Ipd, so that the AC component of the photocurrent Ipd can be attenuated. Therefore, the variable resistance circuit 53 controls a gain of the transimpedance amplifier circuit 10A.

An output impedance of the resistance terminal 53b may be determined in consideration of the input impedance Zin of the TIA unit 11. For example, when a variable gain ratio of the TIA unit 11 is A (A is a real number larger than 1), the output impedance of the resistance terminal 53b is set to Zin/(A−1). Thus, when the value of the current signal Iin of the TIA unit 11 when the AGC is not performed is Iinoff, a value Iinon of the current signal Iin when the AGC is performed is Iinon=Iinoff/A. For example, when A=2, the output impedance of the resistance terminal 53b is substantially equal to Zin, and when A is larger than 2, the output impedance of the resistance terminal 53b is a value smaller than Zin. Therefore, when the AOC and the AGC are performed simultaneously, the output impedance of the output terminal 52b is set to be larger than the output impedance of the resistance terminal 53b. When the AGC is not performed, the output impedance of the resistance terminal 53b may be set to 100×Zin or more. The output impedance of the resistance terminal 53b can be considered to be equal to the resistance value $R_{AGC1}$ described above. For example, making the gate voltage of the field effect transistor 57 approximately equal to the threshold voltage of the field effect transistor 57 increases the output impedance of the resistance terminal 53b. Since the input impedance Zin and the output impedance of the resistance terminal 53b may have different frequency characteristics from each other, it is sufficient that the above-described relationship is satisfied at least in a predetermined frequency range (band).

The reference voltage generation circuit 12 includes the voltage amplifier 12a and the feedback resistance element 12b electrically connected between the input and output of the voltage amplifier 12a. With this configuration, the output impedance of the reference voltage generation circuit 12 is low in a wide frequency range. That is, the impedance of the variable resistance circuit 53 viewed from the input terminal of the TIA unit 11 is low in a wide frequency range. Thus, the AC bypass current Iagc1 can be easily drawn from the photocurrent Ipd.

Since the DC offset control is performed using the high-impedance feedback current source 52, the AC component of the photocurrent Ipd is less affected (the AC component does not flow to the feedback current source 52). On the other hand, the gain control is performed by bypassing the AC component of the photocurrent Ipd using the variable resistance circuit 53, and the drain potential and the source potential of the field effect transistor 57 are substantially equal to each other, so that the DC component of the photocurrent Ipd is less affected (no DC component flows to the variable resistance circuit 53). As a result, interference between the DC offset control and the gain control can be avoided.

As described above, according to the transimpedance amplifier circuit 10A, the gain control of the transimpedance amplifier circuit 10A and the DC offset control for setting the difference ΔVtia to 0 can be controlled by a single control loop without interfering with each other.

Figure 16:
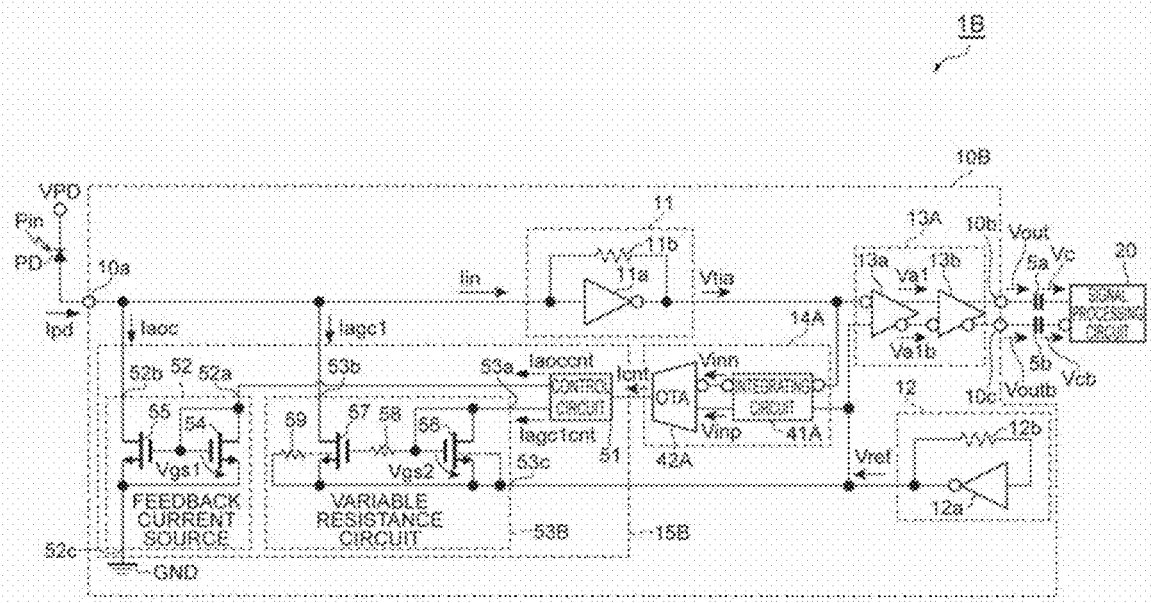
FIG. 16 is a diagram schematically showing a configuration of an optical receiving device including a transimpedance amplifier circuit according to another embodiment.

Next, a transimpedance amplifier circuit according to another embodiment will be described with reference to FIGS. 16 to 18. FIG. 16 is a diagram schematically showing a configuration of an optical receiving device including a transimpedance amplifier circuit according to another embodiment. FIG. 17 is a diagram for explaining an inter-terminal capacitance of a field effect transistor shown in FIG. 16. FIG. 18 is a diagram showing an example of a capacitance value of the inter-terminal capacitance shown in FIG. 17.

As shown in FIG. 16, an optical receiving device 1B mainly differs from the optical receiving device 1A in that the optical receiving device 1B includes a transimpedance amplifier circuit 10B instead of the transimpedance amplifier circuit 10A. The transimpedance amplifier circuit 10B mainly differs from the transimpedance amplifier circuit 10A in that the transimpedance amplifier circuit 10B includes a bypass circuit 15B instead of the bypass circuit 15. The bypass circuit 15B mainly differs from the bypass circuit 15 in that the bypass circuit 15B includes a variable resistance circuit 53B (first variable resistance circuit) instead of the variable resistance circuit 53. The variable resistance circuit 53B mainly differs from the variable resistance circuit 53 in that the variable resistance circuit 53B further includes a resistance element (resistor) 58 (first resistance element) and a resistance element (resistor) 59 (second resistance element). In the variable resistance circuit 53B, a gate of a field effect transistor 57 is electrically connected to a drain and a gate of a field effect transistor 56 via the resistance element 58.

Here, although not usually shown in the circuit diagram, the field effect transistor has a substrate terminal. A substrate terminal (indicated by a dotted line in FIG. 16; first substrate terminal) of the field effect transistor 56 is electrically connected to an output terminal of a reference voltage generation circuit 12 (voltage amplifier 12a) via a resistance terminal 53c. A reference voltage signal Vref is input (supplied) to the substrate terminal of the field effect transistor 56. A substrate terminal (second substrate terminal) of the field effect transistor 57 is electrically connected to the output terminal of the reference voltage generation circuit 12 (voltage amplifier 12a) via the resistance element 59 and the resistance terminal 53c. The reference voltage signal Vref is input (supplied) to the substrate terminal of the field effect transistor 57 via the resistance element 59. Since no DC current flows to the substrate terminal of the field effect transistor 57, a (DC) potential of the substrate terminal of the field effect transistor 57 is set to a potential of the reference voltage signal Vref, similarly to a (DC) potential of the substrate terminal of the field effect transistor 56.

As shown in FIG. 17, the field effect transistor 57 has a capacitance component between the gate (G), the source (S), the drain (D), and the substrate terminal (B). FIG. 18 shows an example of a capacitance value of each capacitance component. The capacitance value shown in FIG. 18 is a typical capacitance value when the field effect transistor 57 is a 130 nm CMOS process, a gate width (channel width) W of the field effect transistor 57 is 30 μm, a gate length (channel length) L of the field effect transistor 57 is 0.13 μm, and the field effect transistor 57 operates in a deep triode region.

A capacitance value of a gate-source capacitance Cgs (second capacitance) and a capacitance value of a gate-drain capacitance Cgd (first capacitance) are equal to each other, which is 7.1 fF. The capacitance value of a drain-source capacitance Cds is 2.6 fF. A capacitance value of a capacitance Cgb between the gate and the substrate terminal, a capacitance value of a capacitance Csb (fourth capacitance) between the source and the substrate terminal, and a capacitance value of a capacitance Cdb (third capacitance) between the drain and the substrate terminal are equal to each other, which is 0.6 fF. As described above, the field effect transistor 57 has symmetrical capacitances (capacitance Cgs and capacitance Cgd) on the source side and the drain side with respect to the gate. In other words, the field effect transistor 57 is configured such that the capacitance Cgd and the capacitance Cgs are equal to each other. Similarly, the field effect transistor 57 has symmetrical capacitances (capacitance Csb and capacitance Cdb) on the source side and the drain side also with respect to the substrate terminal. In other words, the field effect transistor 57 is configured such that the capacitance Cdb and the capacitance Csb are equal to each other.

In a case where the number of fingers indicating the number of gates of the field effect transistor is an odd number, when the number of drains and the number of sources are made equal, the field effect transistor 57 in which the capacitance value of the capacitance Cgs and the capacitance value of the capacitance Cgd are equal to each other and the capacitance value of the capacitance Csb and the capacitance value of the capacitance Cdb are equal to each other can be obtained. For example, in a case of a MOS transistor having three fingers, the MOS transistor may be configured to have the drain D, the gate G, the source S, the gate G, the drain D, the gate G, and the source S in this order.

The capacitance value of the capacitance Csb is about 1/10 of the capacitance value of the capacitance Cgs, and the capacitance value of the capacitance Cdb is about 1/10 of the capacitance value of the capacitance Cgd. While the capacitances Csb and Cdb have a junction capacitance associated with a PN junction as a main component, the capacitances Cgs and Cgd have an overlap capacitance due to a gate oxide film as a main component. As described above, the capacitances Csb and Cdb are sufficiently smaller than the capacitances Cgs and Cgd unless the areas of the source and drain are intentionally increased.

A resistance value Rg of the resistance element 58 is sufficiently larger than an impedance Zcgd due to the capacitance Cgd and an impedance Zcgs due to the capacitance Cgs at high frequencies. A resistance value Rb of the resistance element 59 is sufficiently larger than an impedance Zcdb due to the capacitance Cdb and the impedance Zcsb due to the capacitance Csb.

In the variable resistance circuit 53B configured as above, the control current Iagc1cnt flowing from the control terminal 53a flows to the field effect transistor 56 diode-connected, so that a gate-source voltage Vgs2 is generated between the gate and source of the field effect transistor 56. The gate of the field effect transistor 56 and the gate of the field effect transistor 57 are electrically connected to each other via the resistance element 58, and the source of the field effect transistor 56 and the source of the field effect transistor 57 are electrically connected to each other. Since gate resistances of the field effect transistors 56 and 57 are much larger than the resistance value of the resistance element 58, a gate-source voltage of the field effect transistor 57 is equal to the gate-source voltage Vgs2. The reference voltage signal Vref is supplied to the source of the field effect transistor 57, and the input potential of the TIA unit 11 is applied to the drain of the field effect transistor 57. Since the reference voltage signal Vref has substantially the same potential as the input potential of the TIA unit 11, the field effect transistor 57 operates in a deep triode region (linear region). When the drain voltage of the field effect transistor 57 increases in the linear region, the drain current increases accordingly. Especially when the drain voltage is relatively small, the drain current can be considered changed (linearly) in proportion to the drain voltage. That is, the reference voltage generation circuit 12 grounds the field effect transistors 56 and 57 of the variable resistance circuit 53B in an alternating current manner and the field effect transistor 57 is biased in the deep triode region.

Here, since the field effect transistor 56 is diode-connected, the gate of the field effect transistor 57 is electrically connected to the output terminal of the reference voltage generation circuit 12 (voltage amplifier 12a) by the resistance element 58 and the differential resistance of the diode-connected field effect transistor 56. A differential resistance value of the diode-connected field effect transistor 56 is about several kΩ, which is considerably smaller than the impedance Zcgd due to the capacitance Cgd of the field effect transistor 57. The impedance Zcgd is, for example, 22 kΩ at 1 GHz. Assuming that the resistance value Rg of the resistance element 58 is 0Ω, a gate potential of the field effect transistor 56 follows a low-impedance source potential (potential of the reference voltage signal Vref). In this case, as shown in the above Formula (3), the gate-source voltage Vgs2 is expressed by adding the drain-source voltage Vds to the gate-source voltage Vgs0.

Therefore, also in the variable resistance circuit 53B, a drain current Id of the field effect transistor 57 biased in the triode region (that is, the AC bypass current Iagc1) may be represented by the above Formula (4), and a resistance value $R_{AGC1}$ may be represented by the above Formula (5). Similarly, since a transconductance gin in the triode region may be represented by the above Formula (6), the transconductance gin in the triode region becomes negligibly small as compared with the transconductance in saturation operation.

On the other hand, since the resistance value Rg of the resistance element 58 is larger than the impedance Zcgd due to the capacitance Cgd (Rg>>Zcgd), the resistance element 58 isolates the gate of the field effect transistor 57 from the gate of the field effect transistor 56 in a high-frequency manner (in an alternating current manner). Since the capacitance value of the capacitance Cgs and the capacitance value of the capacitance Cgd are equal to each other, the drain-source voltage Vds is divided into half, and a voltage (Vds/2) which is half of the drain-source voltage Vds is applied to the gate of the field effect transistor 57.

Since the gate of the field effect transistor 57 can be electrically continuous with the substrate terminal of the field effect transistor 57 in a high frequency manner via the capacitance Cgb, the potential of the substrate terminal of the field effect transistor 57 can slightly affect the gate potential of the field effect transistor 57 via the capacitance Cgb. However, since the resistance value Rb of the resistance element 59 is larger than the impedance Zcdb due to the capacitance Cdb (Rb>>Zcdb), the resistance element 59 isolates the substrate terminal of the field effect transistor 57 from the source of the field effect transistor 57 in a high-frequency manner Since the capacitance value of the capacitance Csb and the capacitance value of the capacitance Cdb are equal to each other, the drain-source voltage Vds is divided into half, and the voltage (Vds/2) which is half of the drain-source voltage Vds is applied to the substrate terminal of the field effect transistor 57. Thus, the influence of the potential of the substrate terminal of the field effect transistor 57 on the gate potential of the field effect transistor 57 is reduced.

In this case, as shown in Formula (8), the gate-source voltage Vgs2 is expressed by adding half of the drain-source voltage Vds to the gate-source voltage Vgs0.

[Formula 8]
$$Vgs2 = Vgs0 + \frac{Vds}{2} \quad (8)$$

Formula (9) is obtained by substituting Formula (8) into Formula (2). As shown in Formula (9), the drain current Id (AC bypass current Iagc1) is proportional to the drain-source voltage Vds, and thus does not include a non-linear component.

[Formula 9]
$$Iagc1 = Id = \frac{\beta}{2} \times \left\{ 2 \times \left(Vgs0 + \frac{Vds}{2} - Vth\right) \times Vds - Vds^2 \right\} = \quad (9)$$
$$\beta \times (Vgs0 - Vth) \times Vds$$

As shown in Formula (10), the differential resistance value Rd (resistance value $R_{AGC1}$) is obtained by differentiating Formula (9) with respect to the drain-source voltage Vds and calculating a reciprocal of the calculation result. As shown in Formula (10), the resistance value $R_{AGC1}$ does not change with the drain-source voltage Vds.

[Formula 10]
$$R_{AGC1} = Rd = \frac{1}{\frac{\partial Id}{\partial Vds}} = \frac{1}{\beta \times (Vgs0 - Vth)} \quad (10)$$

In other words, by superimposing half (Vds/2) of the drain-source voltage Vds on the gate voltage of the field effect transistor 57 operating in the triode region, the differential resistance value Rd (resistance value $R_{AGC1}$) of the field effect transistor 57 does not depend on the drain-source voltage Vds, and does not vary from a resistance value when the drain-source voltage Vds is 0 V.

That is, although the variable resistance circuit 53B has the same circuit configuration as a feedback current source 52, the variable resistance circuit 53B does not operate as a current mirror circuit, and the field effect transistor 57 operates as a linear variable resistor controlled by the gate-source voltage Vgs2. Since a potential of the resistance terminal 53*b* and a potential of the resistance terminal 53*c* are substantially the same, the DC component of a photocurrent Ipd hardly flows to the variable resistance circuit 53B, and the AC component of the photocurrent Ipd partially flows as the AC bypass current Iagc1 into the variable resistance circuit 53B (field effect transistor 57). In other words, the variable resistance circuit 53B flows the AC bypass current Iagc1 between the drain and source of the field effect transistor 57 in accordance with the control current Iagc1cnt.

That is, the photocurrent Ipd increases, the difference ΔVtia increases, and when the control current Icnt exceeds the current value of the offset current Iofs, the control current Iagc1cnt is supplied to the variable resistance circuit 53B. As a result, the gate-source voltage Vgs2 is generated in the field effect transistors 56 and 57. As the gate-source voltage Vgs2 increases, the resistance value $R_{AGC1}$ of the field effect transistor 57 decreases, so that the signal component (AC component) of the photocurrent Ipd excluding the DC component is partially drawn as the AC bypass current Iagc1. As a result, a possibility that the TIA unit 11 will be saturated by a large signal input is reduced.

As described above, a current proportional to the drain-source voltage flows between the drain and source of the field effect transistor 57 biased in the deep triode region (linear region). Since the reference voltage signal Vref has substantially the same potential as the input potential of the TIA unit 11, no DC current flows, and the AC bypass current Iagc1 does not disturb the DC offset control. The change in the resistance value $R_{AGC1}$ of the field effect transistor 57 affects only characteristics of an AOC control gain.

Since the resistance value $R_{AGC1}$ of the field effect transistor 57 does not depend on the drain-source voltage Vds, the AC bypass current Iagc1 is drawn from the photocurrent Ipd with low distortion. As a result, occurrence of distortion is suppressed.

Figure 19A:
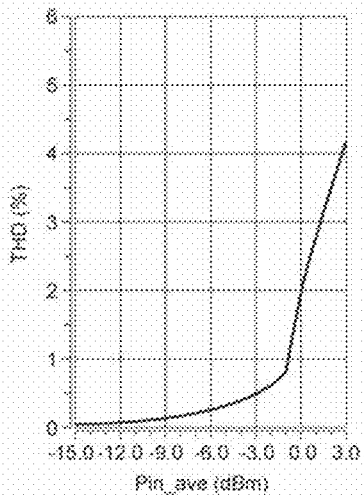
FIG. 19A is a diagram showing a change in total harmonic distortion with respect to an average input light power in the transimpedance amplifier circuit shown in FIG. 16.
Figure 19B:
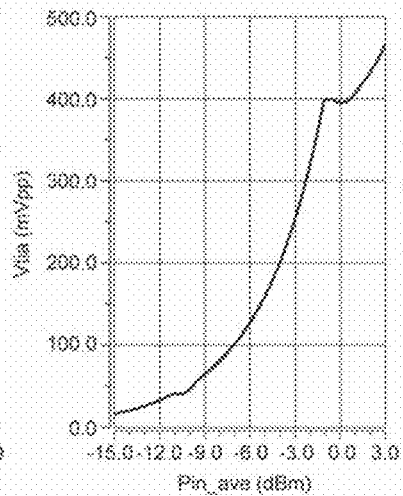
FIG. 19B is a diagram showing a change in output amplitude of a TIA unit with respect to the average input light power in the transimpedance amplifier circuit shown in FIG. 16.
Figure 19C:
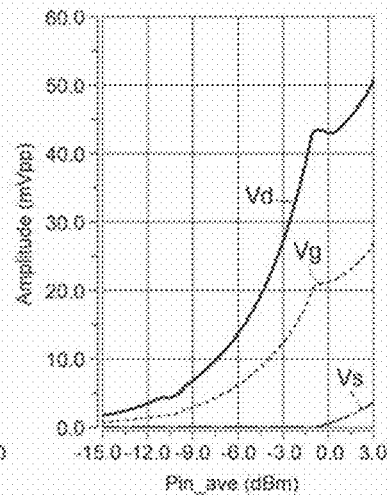
FIG. 19C is a diagram showing a change in amplitude at each terminal of the field effect transistor with respect to the average input light power in the transimpedance amplifier circuit shown in FIG. 16.
Figure 20A:
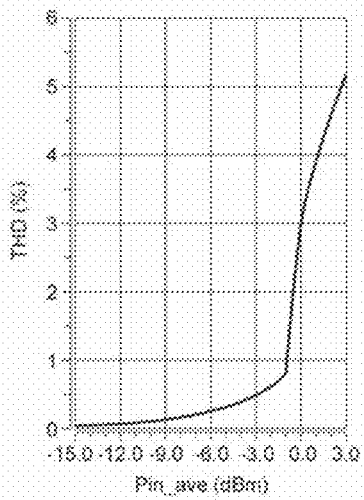
FIG. 20A is a diagram showing a change in total harmonic distortion with respect to an average input light power in a transimpedance amplifier circuit of a second comparative example.
Figure 20B:
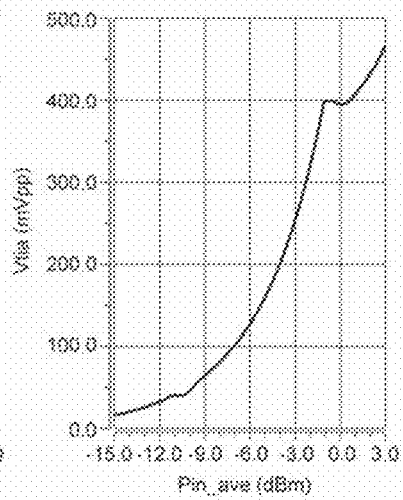
FIG. 20B is a diagram showing a change in output amplitude of a TIA unit with respect to the average input light power in the transimpedance amplifier circuit of the second comparative example.
Figure 20C:
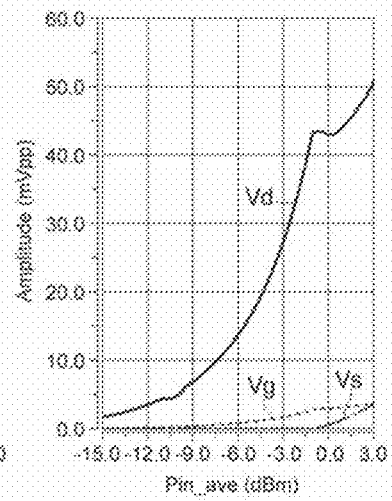
FIG. 20C is a diagram showing a change in amplitude at each terminal of a field effect transistor with respect to the average input light power in the transimpedance amplifier circuit of the second comparative example.

Next, the function and effect of the transimpedance amplifier circuit 10B will be described. FIG. 19A is a diagram showing a change in total harmonic distortion with respect to an average input light power in the transimpedance amplifier circuit shown in FIG. 16. FIG. 19B is a diagram showing a change in output amplitude of a TIA unit with respect to the average input light power in the transimpedance amplifier circuit shown in FIG. 16. FIG. 19C is a diagram showing a change in amplitude at each terminal of the field effect transistor with respect to the average input light power in the transimpedance amplifier circuit shown in FIG. 16. FIG. 20A is a diagram showing a change in total harmonic distortion with respect to an average input light power in a transimpedance amplifier circuit of a second comparative example. FIG. 20B is a diagram showing a change in output amplitude of a TIA unit with respect to the average input light power in the transimpedance amplifier circuit of the second comparative example. FIG. 20C is a diagram showing a change in amplitude at each terminal of a field effect transistor with respect to the average input light power in the transimpedance amplifier circuit of the second comparative example.

The horizontal axes of FIGS. 19A to 19C and FIGS. 20A to 20C represent an average input light power Pin_ave (unit: dBm), that is an average value of an optical input power of an optical signal Pin. The vertical axes of FIGS. 19A and 20A represent the total harmonic distortion (THD) (unit: %) of an output waveform (waveform of the differential voltage signal Vout,Voutb). The vertical axes of FIGS. 19B and 20B represent an amplitude (unit: mVpp) of a voltage signal Vtia. The vertical axes in FIGS. 19C and 20C represent amplitudes (unit: mVpp) of a drain potential Vd, a gate potential Vg, and a source potential Vs of the field effect transistor 57.

The calculation results shown in FIGS. 19A to 19C are the calculation results in the transimpedance amplifier circuit 10B (hereinafter, referred to as "second example"). The calculation results shown in FIGS. 20A to 20C are the calculation results in the transimpedance amplifier circuit of the second comparative example (hereinafter, referred to as "second comparative example"). The transimpedance amplifier circuit of the second comparative example mainly differs from the transimpedance amplifier circuit 10B in the resistance value Rg of the resistance element 58 and the resistance value Rb of the resistance element 59. In the transimpedance amplifier circuit of the second example, the resistance value Rg of the resistance element 58 is set to 200 kΩ, and the resistance value Rb of the resistance element 59 is set to 5 kΩ. In the transimpedance amplifier circuit of the second comparative example, both the resistance value Rg of the resistance element 58 and the resistance value Rb of the resistance element 59 are set to 0Ω.

The current value of the offset current Iofs is set so that the AGC operates when the average input light power Pin_ave exceeds around −1 dBm. As the total harmonic distortion, the total harmonic distortion considering up to the 10th harmonic is calculated. In order to prevent distortion from occurring in a differential amplifier circuit 13A provided at the next stage, the size of the field effect transistor 57 is determined so that the maximum amplitude of the voltage signal Vtia does not exceed 500 mVpp. A gain (voltage gain) of the TIA unit 11 is set to 10 times, and a resistance value of a feedback resistance element 11b is set to 550Ω. As the optical signal Pin, an optical signal obtained by intensity modulation with a 1 GHz sine wave is used, and the amplitude of the optical signal Pin is set to be the same as the average input light power Pin_ave (extinction ratio of about 5 dB). A photoelectric conversion gain of the photodetector PD is set to 1.0 A/W in order to simplify the calculation.

Comparing FIG. 19A and FIG. 20A, it can be seen that when the average input light power Pin_ave is 3 dBm, the THD is 5.2% in the second comparative example, whereas the THD is reduced to 4.1% in the second example. Comparing FIG. 19B and FIG. 20B, it can be seen that the amplitudes of the voltage signals Vtia are controlled to be equal to each other in the second comparative example and the second example. That is, it can be seen that although an amount of drawing of the AC bypass current Iagc1 in the second example is equivalent to that in the second comparative example, the THD of the second example is improved compared to the THD of the second comparative example. According to FIG. 20C, since the gate-source voltage Vgs2 of the second comparative example is represented by Formula (3), it can be seen that the amplitude of the gate potential Vg is substantially equal to the amplitude of the source potential Vs. On the other hand, according to FIG. 19C, it can be seen that in the second example, the amplitude of the gate potential Vg is approximately half the amplitude of the drain potential Vd. This indicates that the drain-source voltage Vds of the field effect transistor 57 is divided by the capacitance Cgs and the capacitance Cgd, and the gate-source voltage Vgs2 is represented by Formula (8). According to FIGS. 19C and 20C, in both the second comparative example and the second example, when the average input light power Pin_ave exceeds −1 dB, the amplitude of the source potential Vs increases. This is due to the fact that since the output impedance of the reference voltage generation circuit 12 is not 0, the reference voltage signal Vref is modulated by the photocurrent Ipd as the AC bypass current Iagc1 increases. As described above, during gain control (during the AGC operation), the THD can be improved by about 1% in the second example compared to the second comparative example.

As described above, in the transimpedance amplifier circuit 10B, the bypass circuit 15B generates the DC bypass current Iaoc and the AC bypass current Iagc1, and the DC bypass current Iaoc and the AC bypass current Iagc1 are drawn from the photocurrent Ipd generated by the photodetector PD, so that the current signal Iin is generated. Then, the TIA unit 11 converts the current signal Iin into the voltage signal Vtia, and the differential amplifier circuit 13A generates the differential voltage signal Vout,Voutb in accordance with the difference ΔVtia between the voltage signal Vtia and the reference voltage signal Vref. In the variable resistance circuit 53B, the field effect transistor 56 is diode-connected, so that when the drain of the field effect transistor 56 receives the control current Iagc1cnt, the gate-source voltage Vgs2 is generated between the gate and source of the field effect transistor 56. The gate of the field effect transistor 56 and the gate of the field effect transistor 57 are electrically connected to each other via the resistance element 58, and the reference voltage signal Vref is supplied to the source of the field effect transistor 56 and the source of the field effect transistor 57. Since the gate resistances of the field effect transistors 56 and 57 are much larger than the resistance value Rg of the resistance element 58, the gate-source voltage of the field effect transistor 57 is equal to the gate-source voltage Vgs2.

The reference voltage signal Vref is supplied to the source of the field effect transistor 57, and the drain of the field effect transistor 57 is electrically connected to the input terminal 10a, so that there is almost no potential difference between the drain and source of the field effect transistor 57. As a result, the field effect transistor 57 operates in the (deep) triode region. Thus, the field effect transistor 57 functions as a variable resistor, and an output impedance of the drain of the field effect transistor 57 decreases. Since there is almost no potential difference between the drain and source of the field effect transistor 57, although the DC component of the photocurrent Ipd hardly flows into the field effect transistor 57, the AC component of the photocurrent Ipd may flow as the AC bypass current Iagc1 into the field effect transistor 57. The control current Iagc1cnt is obtained by amplifying a difference (difference current)

between a current generated by amplifying the control current Icnt and the offset current Iofs with the amplification factor γ. Therefore, when the control current Icnt exceeds the current value of the offset current Iofs, the control current Iagc1cnt increases as the control current Icnt increases, and the gate-source voltage Vgs2 of the field effect transistor 56 also increases. Thus, when the photocurrent Ipd has a small or medium signal intensity, the drawing of the AC bypass current Iagc1 is suppressed, so that the attenuation of the AC component of the photocurrent Ipd can be avoided. When the photocurrent Ipd has a large signal intensity, the AC component of the photocurrent Ipd is drawn as the AC bypass current Iagc1 from the photocurrent Ipd, so that the AC component of the photocurrent Ipd can be attenuated. Thus, the variable resistance circuit 53B controls a gain of the transimpedance amplifier circuit 10B.

The gate of the field effect transistor 57 is electrically connected to the gate of the field effect transistor 56 via the resistance element 58, and the field effect transistor 56 is diode-connected, so that the gate of the field effect transistor 57 is connected to the output terminal (reference voltage signal Vref) of the reference voltage generation circuit 12 via the resistance element 58 and the differential resistance of the field effect transistor 56. However, since the resistance value Rg of the resistance element 58 is larger than the impedance Zcgd due to the capacitance Cgd, the resistance element 58 can isolate the gate of the field effect transistor 57 from the gate of the field effect transistor 56 in a high-frequency manner Therefore, a voltage obtained by dividing the drain-source voltage Vds by the capacitance Cgd and the capacitance Cgs is applied to the gate of the field effect transistor 57. Since the field effect transistor 57 is configured such that the capacitance Cgd and the capacitance Cgs are equal to each other, a voltage that is about half the drain-source voltage Vds is applied to the gate of the field effect transistor 57. As a result, the variation of the differential resistance value (resistance value $R_{AGC1}$) of the field effect transistor 57 due to the drain-source voltage Vds is suppressed. As a result, since occurrence of distortion is suppressed, a signal quality can be improved.

The output impedance of the resistance terminal 53b of the variable resistance circuit 53B may be determined in consideration of the input impedance Zin of the TIA unit 11, similarly to the output impedance of the resistance terminal 53b of the variable resistance circuit 53.

Since the substrate terminal of the field effect transistor 57 is electrically connected to the gate of the field effect transistor 57 via the capacitance Cgb, the potential of the substrate terminal of the field effect transistor 57 can affect the gate potential of the field effect transistor 57 via the capacitance Cgb. On the other hand, the reference voltage signal Vref is supplied to the substrate terminal of the field effect transistor 57 via the resistance element 59, and the resistance value Rb of the resistance element 59 is larger than the impedance Zcdb due to the capacitance Cdb (Rb>>Zcdb) and larger than the impedance Zcsb due to the capacitance Csb (Rb>>Zcsb), so that the resistance element 59 can isolate the substrate terminal of the field effect transistor 57 from the outside of the field effect transistor 57 in a high-frequency manner. Since the field effect transistor 57 is configured such that the capacitance Cdb and the capacitance Csb are equal to each other, a voltage that is about half the drain-source voltage Vds is applied to the substrate terminal of the field effect transistor 57. As a result, the potential of the substrate terminal of the field effect transistor 57 becomes approximately the same as the gate potential of the field effect transistor 57, so that the influence of the potential of the substrate terminal of the field effect transistor 57 on the gate potential of the field effect transistor 57 can be reduced. As a result, since the occurrence of distortion is further suppressed, the signal quality can be further improved.

The bypass circuit 15B includes the feedback current source 52 that generates the DC bypass current Iaoc based on the control current Icnt, and the variable resistance circuit 53B that generates the AC bypass current Iagc1 based on the control current Icnt. The control circuit 51 controls the feedback current source 52 so that the DC bypass current Iaoc increases as the control current Icnt increases, and controls the variable resistance circuit 53B so that the AC bypass current Iagc1 increases as the control current Icnt increases when the control current Icnt exceeds the current value of the offset current Iofs. According to this configuration, it is possible to realize the control for removing the DC component and the gain control for the transimpedance amplifier circuit 10B with a single control loop, so that the increase of the circuit scale can be suppressed.

In the feedback current source 52, the field effect transistor 54 is diode-connected, so that when the drain of the field effect transistor 54 receives the control current Iaocnt, the gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that the gate-source voltage of the field effect transistor 55 is equal to the gate-source voltage Vgs1. The source of the field effect transistor 55 is electrically connected to the source of the field effect transistor 54, that is, the ground potential GND, and the drain of the field effect transistor 55 is electrically connected to the input terminal 10a, so that a potential difference between the source and drain of the field effect transistor 55 increases. As a result, the field effect transistor 55 operates in the saturation region. Thus, the field effect transistor 55 functions as a current source, and an output impedance of the drain of the field effect transistor 55 increases. Thus, although the AC component of the photocurrent Ipd hardly flows into the field effect transistor 55, the DC component of the photocurrent Ipd may flow as the DC bypass current Iaoc into the field effect transistor 55. Then, as the control current Icnt increases, the gate-source voltage Vgs1 of the field effect transistor 54 increases, so that the drain current of the field effect transistor 55 increases accordingly. As a result, the DC component of the photocurrent Ipd is drawn as the DC bypass current Iaoc from the photocurrent Ipd, and the DC component is suitably removed from the photocurrent Ipd. The magnitude of the output impedance of the output terminal 52b may be determined in consideration of the input impedance of the TIA unit 11. For example, when the input impedance of the TIA unit 11 is Zin, the output impedance of the output terminal 52b may be set to 100×Zin or more. Since the input impedance Zin and the output impedance of the output terminal 52b may have different frequency characteristics from each other, it is sufficient that such a relationship is satisfied at least in a predetermined frequency range (band).

The reference voltage generation circuit 12 includes the voltage amplifier 12a and the feedback resistance element 12b electrically connected between the input and output of the voltage amplifier 12a. With this configuration, the output impedance of the reference voltage generation circuit 12 is low in a wide frequency range. That is, the impedance of the variable resistance circuit 53B viewed from the input terminal of the TIA unit 11 is low in a wide frequency range. Thus, the AC bypass current Iagc1 can be easily drawn from the photocurrent Ipd.

Since the DC component is removed using the high-impedance feedback current source 52, the AC component of the photocurrent Ipd is less affected (no AC component flows to the feedback current source 52). On the other hand, the gain control is performed by bypassing the AC component of the photocurrent Ipd using the variable resistance circuit 53B, and the drain potential and the source potential of the field effect transistor 57 are substantially equal to each other, so that the DC component of the photocurrent Ipd is less affected (no DC component flows to the variable resistance circuit 53B). As a result, interference between the control of the removal of the DC component and the gain control can be avoided.

As described above, according to the transimpedance amplifier circuit 10B, the gain control of the transimpedance amplifier circuit 10B and the DC offset control for setting the difference ΔVtia to 0 can be performed by a single control loop without interfering with each other, and the gain control can be performed with low distortion.

Figure 21:
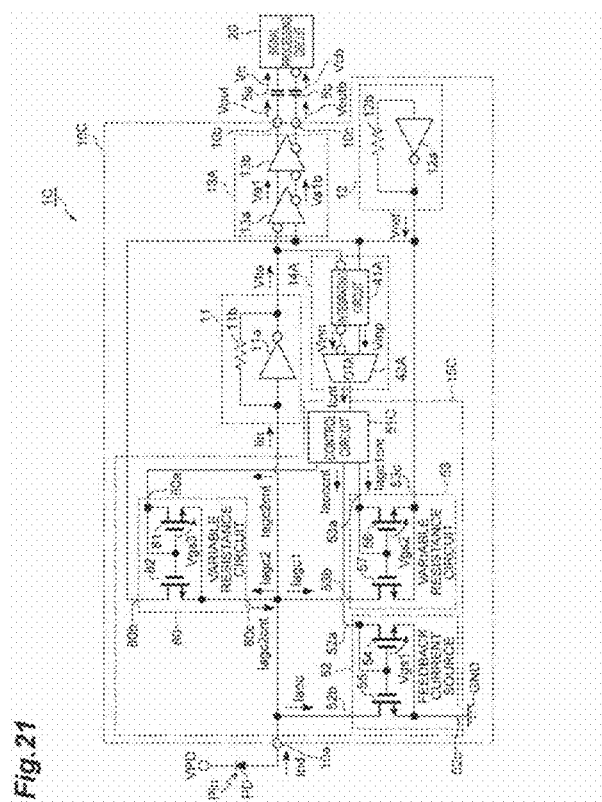
FIG. 21 is a diagram schematically showing a configuration of an optical receiving device including a transimpedance amplifier circuit according to still another embodiment.
Figure 22:
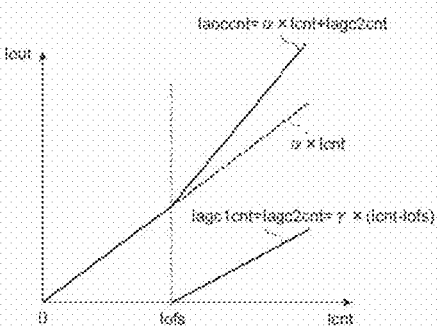
FIG. 22 is a diagram showing a relationship between a control current supplied to a control circuit shown in FIG. 21 and currents generated by the control circuit.
Figure 23:
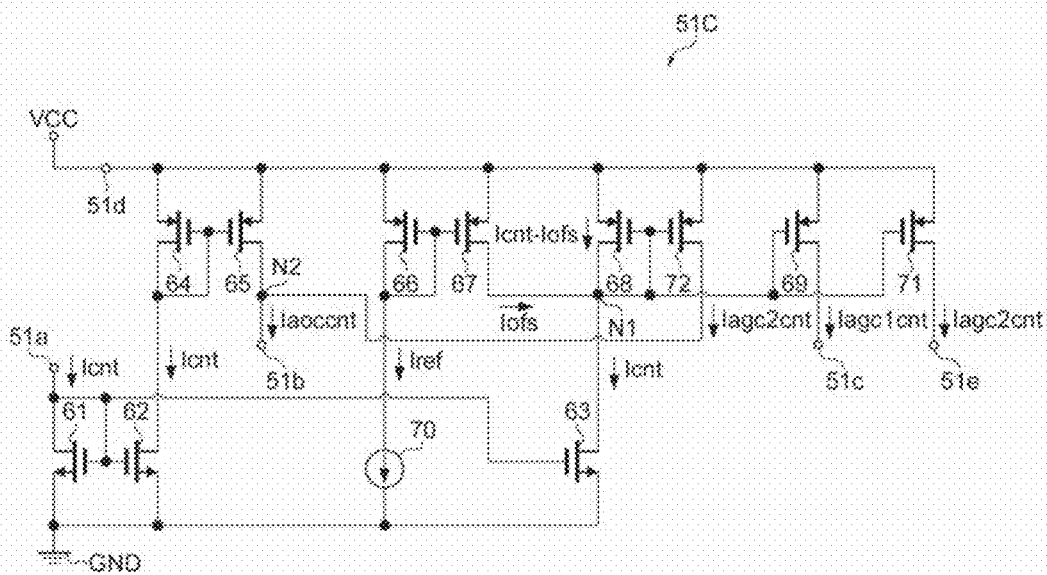
FIG. 23 is a diagram showing a circuit configuration example of the control circuit shown in FIG. 21.

Next, a transimpedance amplifier circuit according to still another embodiment will be described with reference to FIGS. 21 to 23. FIG. 21 is a diagram schematically showing a configuration of an optical receiving device including a transimpedance amplifier circuit according to still another embodiment. FIG. 22 is a diagram showing a relationship between a control current supplied to a control circuit shown in FIG. 21 and currents generated by the control circuit. FIG. 23 is a diagram showing a circuit configuration example of the control circuit shown in FIG. 21.

As shown in FIG. 21, an optical receiving device 1C mainly differs from the optical receiving device 1A in that the optical receiving device 1C includes a transimpedance amplifier circuit 10C instead of the transimpedance amplifier circuit 10A. The transimpedance amplifier circuit 10C mainly differs from the transimpedance amplifier circuit 10A in that the transimpedance amplifier circuit 10C includes a bypass circuit 15C instead of the bypass circuit 15. In the transimpedance amplifier circuit 10C, the current signal Iin is generated by drawing the DC bypass current Iaoc, the AC bypass current Iagc1, and the AC bypass current Iagc2 (another AC bypass current, second AC bypass current) from the photocurrent Ipd.

The bypass circuit 15C mainly differs from the bypass circuit 15 in that the bypass circuit 15C generates the DC bypass current Iaoc, the AC bypass current Iagc1, and the AC bypass current Iagc2 based on the control current Icnt, that the bypass circuit 15C includes a control circuit 51C instead of the control circuit 51, and that the bypass circuit 15C further includes a variable resistance circuit 80 (another variable resistance circuit, second variable resistance circuit). The control circuit 51C mainly differs from the control circuit 51 in that when the control current Icnt exceeds the current value of the offset current Iofs, the control circuit 51C controls the variable resistance circuits 53 and 80 so that the AC bypass currents Iagc1 and Iagc2 increase as the control current Icnt increases.

Specifically, the control circuit 51C receives the control current Icnt from the control current circuit 14 (OTA 42A), and generates the control current Iaoccnt, the control current Iagc1cnt, and the control current Iagc2cnt (third control current) in accordance with the control current Icnt. The control circuit 51C outputs the control current Iaoccnt to the feedback current source 52, and controls the feedback current source 52 by the control current Iaoccnt. The control circuit 51C outputs the control current Iagc1cnt to the variable resistance circuit 53, and controls the variable resistance circuit 53 by the control current Iagc1cnt. The control circuit 51C outputs the control current Iagc2cnt to the variable resistance circuit 80, and controls the variable resistance circuit 80 by the control current Iagc2cnt.

As shown in FIG. 22, the current values of the control current Iagc1cnt and the control current Iagc2cnt are proportional to the current value of the control current Icnt when the current value of the control current Icnt is larger than the current value of the offset current Iofs. In other words, the current values of the control current Iagc1cnt and the control current Iagc2cnt are γ times the current value obtained by subtracting the current value of the offset current Iofs from the control current Icnt (Iagc1cnt=Iagc2cnt=γ×(Icnt−Iofs)). The control circuit 51C, for example, generates the offset current Iofs having a predetermined current value (offset current value), and generates the control current Iagc1cnt and the control current Iagc2cnt by amplifying the difference (difference current) between the current (in this case, the control current Icnt), generated by amplifying the control current Icnt, and the offset current Iofs with the amplification factor γ.

The current value of the control current Iaoccnt is a value obtained by adding the current value of the control current Iagc2cnt to α times the current value of the control current Icnt (Iaoccnt=α×Icnt+Iagc2cnt). The control circuit 51C generates the control current Iaoccnt by, for example, adding the control current Iagc2cnt to a current generated by amplifying the control current Icnt with the amplification factor α. Thus, in the control current Iaoccnt, the amplification factor α is adjusted, and in the control currents Iagc1cnt and Iagc2cnt, an offset current value for determining a current for starting automatic gain control (AGC) and the amplification factor γ for determining the control sensitivity of the AGC are adjusted.

The control circuit 51C shown in FIG. 23 has a circuit configuration for realizing the control current Iaoccnt, the control current Iagc1cnt, and the control current Iagc2cnt shown in FIG. 22. As shown in FIG. 23, the circuit configuration of the control circuit 51C mainly differs from the circuit configuration of the control circuit 51 in that the control circuit 51C further includes an output terminal 51e and transistors 71 and 72. The output terminal 51e is electrically connected to a control terminal 80a of the variable resistance circuit 80, and outputs the control current Iagc2cnt to the variable resistance circuit 80.

The transistors 71 and 72 are, for example, field effect transistors (FETs) having a MOS structure. In the example shown in FIG. 23, the transistors 71 and 72 are P-channel MOS transistors. The transistors 68 and 71 and the transistors 68 and 72 each constitute a current mirror circuit. The transistor 68 functions as an input transistor, and the transistors 71 and 72 function as output transistors. Sources of the transistors 71 and 72 are electrically connected to the power supply terminal 51d. A gate of each of the transistors 71 and 72 is electrically connected to the gate and drain of the transistor 68. A drain of the transistor 71 is electrically connected to the output terminal 51e. A drain of the transistor 72 is electrically connected to the output terminal 51b via a node N2.

As described above, only when the current value of the control current Icnt is larger than the current value of the offset current Iofs, the difference current (Icnt−Iofs) flows to the drain of the transistor 68, and the output current (drain current) having a magnitude proportional to the magnitude of the drain current (difference current) of the transistor 68 is output as the control current Iagc1cnt from the drain of the transistor 69 and is output as the control current Iagc2cnt from each of the drains of the transistors 71 and 72.

In this case, the current mirror ratio of the current mirror circuit constituted by the transistors 68, 69, 71, and 72 is set to 1:γ:γ:γ. That is, the control currents Iagc1cnt and Iagc2cnt are currents (γ×(Icnt−Iofs)) having a magnitude obtained by amplifying the difference current (Icnt-Iofs) by γ times. The control current Iagc1cnt generated by the current mirror circuit of the transistors 68 and 69 flows from the drain of the transistor 69 toward the output terminal 51c. The control current Iagc2cnt generated by the current mirror circuit of the transistors 68 and 71 flows from the drain of the transistor 71 toward the output terminal 51e. The control current Iagc2cnt generated by the current mirror circuit of the transistors 68 and 72 flows from the drain of the transistor 72 toward the node N2, and is combined with the drain current output from the drain of the transistor 65 at the node N2. The drain current of the transistor 65 is a current (α×Icnt) having a magnitude obtained by amplifying the control current Icnt by α times. The drain current of the transistor 65 flows from the drain of the transistor 65 toward the node N2. The control current Iaoccnt is generated by combining the drain current of the transistor 65 and the control current Iagc2cnt, and flows from the node N2 toward the output terminal 51b.

On the other hand, when the current value of the control current Icnt is smaller than the current value of the offset current Iofs, no current flows to the transistor 68, so that the potential of the node N1 is pulled up with high resistance on the power supply voltage VCC side by the transistor 68 diode-connected. Since a drain-source voltage of the transistor 67 decreases, the transistors 66 and 67 do not operate as a current mirror circuit. At this time, since the transistor 67 operates in a triode region (linear region), the potential of the node N1 is pulled up with low resistance on the power supply voltage VCC side.

Since the gate-source voltage is not applied to the transistor 68, a resistance value of the transistor 67 to which the gate-source voltage is applied is smaller than a resistance value of the transistor 68. As described above, the transistor 67 operates in the triode region, so that the transistor 67 cannot supply the offset current Iofs, and at the same time, the control current Icnt from the transistor 63 entirely flows through the transistor 67. As a result, only when the current value of the control current Icnt is larger than the current value of the offset current Iofs (in the region of Icnt−Iofs>0), the control current Iagc1cnt is output from the output terminal 51c and the control current Iagc2cnt is output from the output terminal 51e and the drain of the transistor 72.

Thus, the control current Iagc1cnt and the control current Iagc2cnt have the same current amount and flow in the same direction. That is, the control currents Iagc1cnt and Iagc2cnt flow from the power supply voltage VCC toward the ground potential GND.

Although the input/output characteristic of FIG. 22 can be obtained by the control circuit 51C shown in FIG. 23, the above-described current mirror ratio may be appropriately changed. As the circuit configuration of the control circuit 51C, another circuit configuration capable of obtaining the input/output characteristic of FIG. 22 may be adopted.

Since the circuit configurations of the feedback current source 52 and the variable resistance circuit 53 in the bypass circuit 15C are the same as the circuit configurations of the feedback current source 52 and the variable resistance circuit 53 in the bypass circuit 15, description thereof will be omitted. As will be described later, the control current Iagc2cnt flows out from the variable resistance circuit 80 toward the input terminal of the TIA unit 11 to increase the DC component of the photocurrent Ipd. Thus, the DC bypass current Iaoc generated by the feedback current source 52 is set so as to include the control current Iagc2cnt. Specifically, as shown in FIG. 22, the control current Iaoccnt is generated by adding the control current Iagc2cnt to the current generated by amplifying the control current Icnt with the amplification factor α. As a result, the DC component and the control current Iagc2cnt are drawn as the DC bypass current Iaoc from the photocurrent Ipd. As a result, the DC component and the low frequency component are removed from the difference ΔVtia, and the potential of the voltage signal Vtia is aligned with the potential of the reference voltage signal Vref (DC offset control).

The variable resistance circuit 80 is a circuit that generates the AC bypass current Iagc2 based on the control current Icnt. More specifically, the variable resistance circuit 80 generates the AC bypass current Iagc2 in accordance with the control current Iagc2cnt. The variable resistance circuit 80 has a control terminal 80a, a resistance terminal 80b, and a resistance terminal 80c. The control terminal 80a is electrically connected to the output terminal 51e of the control circuit 51C and receives the control current Iagc2cnt from the control circuit 51C. The resistance terminal 80b is electrically connected to an output terminal of the reference voltage generation circuit 12 (voltage amplifier 12a) and receives the reference voltage signal Vref from the reference voltage generation circuit 12. The resistance terminal 80c is electrically connected to the input terminal 10a. The variable resistance circuit 80 includes a field effect transistor 81 (fifth field effect transistor) and a field effect transistor 82 (sixth field effect transistor).

Each of the field effect transistors 81 and 82 is, for example, an N-channel MOS transistor. The size of the field effect transistor 81 and the size of the field effect transistor 82 may be the same as or different from each other. Sources of the field effect transistors 81 and 82 are electrically connected to each other and also electrically connected to the input terminal 10a via the resistance terminal 80c. A drain of the field effect transistor 81 is electrically connected to the output terminal 51e of the control circuit 51C via the control terminal 80a and receives the control current Iagc2cnt from the control circuit 51C. A gate of the field effect transistor 81 is electrically connected to the drain of the field effect transistor 81. A gate of the field effect transistor 82 is electrically connected to the drain and gate of the field effect transistor 81. A drain of the field effect transistor 82 is electrically connected to the output terminal of the reference voltage generation circuit 12 (voltage amplifier 12a) via the resistance terminal 80b. The reference voltage signal Vref is input (supplied) to the drain of the field effect transistor 82. In other words, a relationship between a resistance terminal connected to the reference voltage generation circuit 12 and a resistance terminal connected to the input terminal 10a is opposite between the variable resistance circuit 53 and the variable resistance circuit 80.

In the variable resistance circuit 80 configured as above, the control current Iagc2cnt flowing from the control terminal 80a flows to the field effect transistor 81 diode-connected, so that a gate-source voltage Vgs3 is generated between the gate and source of the field effect transistor 81. The gate of the field effect transistor 81 and the gate of the field effect transistor 82 are electrically connected to each other, and the source of the field effect transistor 81 and the source of the field effect transistor 82 are electrically connected to each other. Therefore, the gate-source voltage of the field effect transistor 82 is equal to the gate-source voltage Vgs3. The reference voltage signal Vref is supplied to the drain of the field effect transistor 82, and the input potential of the TIA unit 11 is applied to the source of the field effect transistor 82. Since the reference voltage signal Vref has substantially the same potential as the input potential of the TIA unit 11, the field effect transistor 82 operates in a deep triode region (linear region). When the drain voltage of the field effect transistor 82 increases in the linear region, the drain current increases accordingly. Especially when the drain voltage is relatively small, the drain current can be considered to change (linearly) in proportion to the drain voltage. A ratio of the drain voltage to the drain current of the field effect transistor 82 will be expressed as a resistance value $R_{AGC2}$.

As a result, the field effect transistor 82 operates as a variable resistor controlled by the gate-source voltage Vgs3, similarly to the field effect transistor 57. The resistance value $R_{AGC2}$ of the field effect transistor 82 is represented by Formula (5), similarly to the resistance value $R_{AGC1}$. That is, the reference voltage generation circuit 12 grounds the field effect transistor 82 in an alternating current manner and the field effect transistor 82 is biased in the deep triode region. Since a potential of the resistance terminal 80b and a potential of the resistance terminal 80c are substantially the same, the DC component of the photocurrent Ipd hardly flows to the variable resistance circuit 80, and the AC component of the photocurrent Ipd partially flows as the AC bypass current Iagc2 into the variable resistance circuit 80 (field effect transistor 82). In other words, the variable resistance circuit 80 flows the AC bypass current Iagc2 between the drain and source of the field effect transistor 82 in accordance with the control current Iagc2cnt. Since the AC bypass current Iagc2 is an AC component, the AC bypass current Iagc2 may flow from the source of the field effect transistor 82 to the drain of the field effect transistor 82 according to the photocurrent Ipd or may flow from the drain of the field effect transistor 82 to the source of the field effect transistor 82 according to the photocurrent Ipd.

That is, the photocurrent Ipd increases, the difference ΔVtia increases, and when the control current Icnt exceeds the current value of the offset current Iofs, the control current Iagc2cnt is supplied to the variable resistance circuit 80. As a result, the gate-source voltage Vgs3 is generated in the field effect transistors 81 and 82. As the gate-source voltage Vgs3 increases, the resistance value $R_{AGC2}$ of the field effect transistor 82 decreases, so that the signal component (AC component) of the photocurrent Ipd excluding the DC component is partially drawn as the AC bypass current Iagc2. As a result, a possibility that the TIA unit 11 will be saturated by a large signal input is reduced.

The current proportional to the drain-source voltage flows between the drain and source of the field effect transistor 82 biased in the deep triode region (linear region). Since the reference voltage signal Vref has substantially the same potential as the input potential of the TIA unit 11, no DC current flows, and the AC bypass current Iagc2 does not disturb the DC offset control. The change in the resistance value $R_{AGC2}$ of the field effect transistor 82 affects only characteristics of an AOC control gain.

In the variable resistance circuit 80, the control current Iagc2cnt flowing from the control terminal 80a flows into the diode-connected field effect transistor 81, flows out from the resistance terminal 80c toward the input terminal of the TIA unit 11, and increases the DC component of the photocurrent Ipd. As described above, the control current Iagc2cnt is drawn as a portion of the DC bypass current Iaoc by the feedback current source 52. This suppresses occurrence of DC offset in the potential of the voltage signal Vtia due to the control current Iagc2cnt.

Next, a relationship between the variable resistance circuit 53 and the variable resistance circuit 80 will be described. At the input terminal of the TIA unit 11, a maximum amplitude of about 100 mV is generated by the current signal Iin. The drain-source voltages Vds of the field effect transistors 57 and 82 may vary with this potential variation. As described above, the drain of the field effect transistor 57 and the source of the field effect transistor 82 are commonly connected to the input terminal 10a (input terminal of the TIA unit 11), and the source of the field effect transistor 57 and the drain of the field effect transistor 82 are commonly connected to the output terminal of the reference voltage generation circuit 12 (voltage amplifier 12a). For this reason, the drain-source voltages Vds (variation thereof) in opposite directions from each other (having opposite polarities) are generated in the field effect transistor 57 and the field effect transistor 82 due to the above-described potential variation.

Since the variable resistance circuit 53 and the variable resistance circuit 80 are connected in parallel between the input terminal 10a and the output terminal of the reference voltage generation circuit 12, a combined resistance value $R_{AGCT}$ of the variable resistance circuit 53 and the variable resistance circuit 80 viewed from the input terminal 10a (input of the TIA unit 11), the resistance value $R_{AGC1}$, and the resistance value $R_{AGC2}$ satisfy the relationship of Formula (11). Here, the field effect transistor 57 and the field effect transistor 82 are transistors having the same structure, have the same size, and have the same electrical characteristics. That is, the intrinsic gain β, gate-source voltage Vgs0, and threshold voltage Vth of the field effect transistor 57 are respectively equal to the intrinsic gain β, gate-source voltage Vgs0, and threshold voltage Vth of the field effect transistor 82. In this case, although the resistance value $R_{AGC1}$ and the resistance value $R_{AGC2}$ are both represented by Formula (5), the drain-source voltages Vds having opposite polarities are generated in the field effect transistor 57 and the field effect transistor 82, so that the drain-source voltage Vds generated in the field effect transistor 57 is referred to as "+Vds", and the drain-source voltage Vds generated in the field effect transistor 82 is referred to as "−Vds".

[Formula 11]

$$\frac{1}{R_{AGCT}} = \frac{1}{R_{AGC1}} + \frac{1}{R_{AGC2}} = \\ \beta \times (Vgs0 - Vth + Vds) + \beta \times (Vgs0 - Vth - Vds) = \\ 2 \times \beta \times (Vgs0 - Vth) \quad (11)$$

Formula (12) is obtained by rearranging Formula (11). As shown in Formula (12), the combined resistance value $R_{AGCT}$ does not include the component of the drain-source voltage Vds, and therefore does not change with the drain-source voltage Vds. Therefore, the combined resistance value $R_{AGCT}$ does not depend on the drain-source voltage Vds, and does not vary from a resistance value when the drain-source voltage Vds is 0 V. As a result, the AC component is drawn from the photocurrent Ipd with low distortion.

[Formula 12]

$$R_{AGCT} = \frac{1}{2 \times \beta \times (Vgs0 - Vth)} \quad (12)$$

For example, when a potential of the input terminal 10a becomes larger than the reference voltage signal Vref by a voltage Δvds due to a potential variation at the input terminal of the TIA unit 11, the drain-source voltage Vds of the field effect transistor 57 is +Δvds, and the drain-source voltage Vds of the field effect transistor 82 is −Δvds. At this time, in the variable resistance circuit 53, a current Δids due to the voltage Δvds flows from the resistance terminal 53b toward the resistance terminal 53c. On the other hand, in the variable resistance circuit 80, the current Δids due to the voltage Δvds flows from the resistance terminal 80b toward the resistance terminal 80c. These currents Δids flow to the reference voltage generation circuit 12 in opposite directions from each other and are canceled. Thus, the reference voltage signal Vref of the reference voltage generation circuit 12 is substantially constant regardless of the photocurrent Ipd. As a result, the reference voltage signal Vref is stabilized, so that the influence of the drain-source voltage Vds on the combined resistance value $R_{AGCT}$ is further reduced. That is, the variable resistance circuit 53 and the variable resistance circuit 80 have a relationship that compensates for non-linearity. Thus, in the transimpedance amplifier circuit 10C, the current signal Iin can be amplified without being distorted.

Figure 24A:
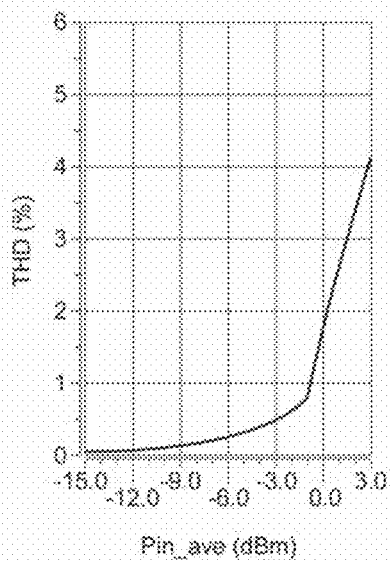
FIG. 24A is a diagram showing a change in total harmonic distortion with respect to the average input light power in the transimpedance amplifier circuit shown in FIG. 21.
Figure 24B:
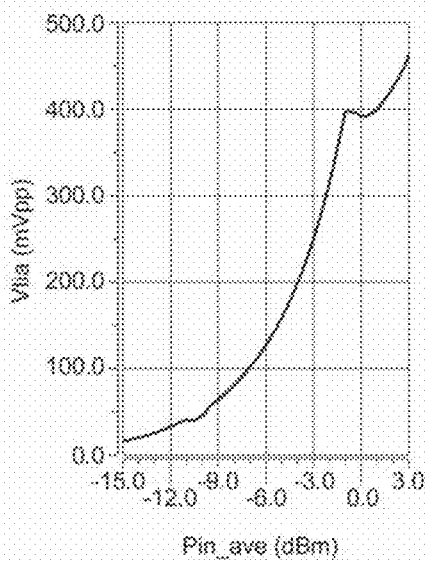
FIG. 24B is a diagram showing a change in output amplitude of a TIA unit with respect to the average input light power in the transimpedance amplifier circuit shown in FIG. 21.
Figure 25A:
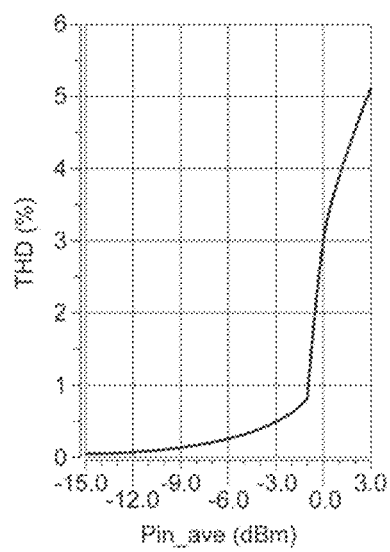
FIG. 25A is a diagram showing a change in total harmonic distortion with respect to the average input light power in a transimpedance amplifier circuit of a third comparative example.
Figure 25B:
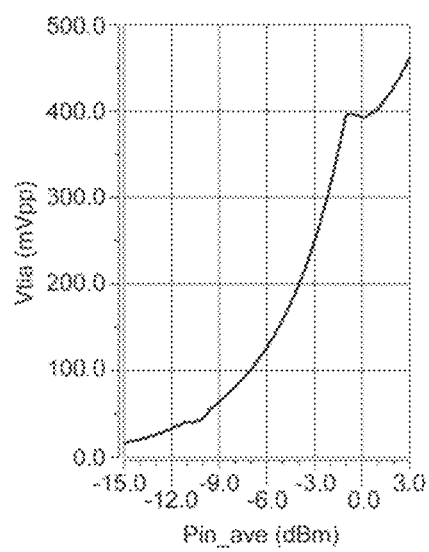
FIG. 25B is a diagram showing a change in output amplitude of a TIA unit with respect to the average input light power in the transimpedance amplifier circuit of the third comparative example.

Next, the function and effect of the transimpedance amplifier circuit 10C will be described. FIG. 24A is a diagram showing a change in total harmonic distortion with respect to the average input light power in the transimpedance amplifier circuit shown in FIG. 21. FIG. 24B is a diagram showing a change in output amplitude of a TIA unit with respect to the average input light power in the transimpedance amplifier circuit shown in FIG. 21. FIG. 25A is a diagram showing a change in total harmonic distortion with respect to an average input light power in a transimpedance amplifier circuit of a third comparative example. FIG. 25B is a diagram showing a change in output amplitude of a TIA unit with respect to the average input light power in the transimpedance amplifier circuit of the third comparative example.

The horizontal axes of FIGS. 24A, 24B, 25A, and 25B represent an average input light power Pin_ave (unit: dBm), that is an average value of an optical input power of an optical signal Pin. The vertical axes of FIGS. 24A and 25A represent the total harmonic distortion (THD) (unit: %) of an output waveform (waveform of the differential voltage signal Vout,Voutb). The vertical axes of FIGS. 24B and 25B represent an amplitude (unit: mVpp) of the voltage signal Vtia.

The calculation results shown in FIGS. 24A and 24B are the calculation results in the transimpedance amplifier circuit 10C (hereinafter, referred to as "third example"). The calculation results shown in FIGS. 25A and 25B are the calculation results in the transimpedance amplifier circuit of the third comparative example (hereinafter, referred to as "third comparative example"). The transimpedance amplifier circuit of the third comparative example mainly differs from the transimpedance amplifier circuit 10C in that the transimpedance amplifier circuit of the third comparative example does not include the variable resistance circuit 80, and the resistance value $R_{AGC1}$ of the field effect transistor 57 is set to half of that in the transimpedance amplifier circuit 10C. That is, the configuration of the transimpedance amplifier circuit of the third comparative example is the same as the configuration of the transimpedance amplifier circuit of the second comparative example.

The current value of the offset current Iofs is set so that the AGC operates when the average input light power Pin_ave exceeds around −1 dBm. As the total harmonic distortion, the total harmonic distortion considering up to the 10th harmonic is calculated. In order to prevent distortion from occurring in a differential amplifier circuit 13A provided at the next stage, the size of the field effect transistor 57 is determined so that the maximum amplitude of the voltage signal Vtia does not exceed 500 mVpp. A gain (voltage gain) of the TIA unit 11 is set to 10 times, and a resistance value of a feedback resistance element 11b is set to 550Ω. As the optical signal Pin, an optical signal obtained by intensity modulation with a 1 GHz sinusoidal wave is used, and the amplitude of the optical signal Pin is set to be the same as the average input light power Pin_ave (extinction ratio of about 5 dB). A photoelectric conversion gain of the photodetector PD is set to 1.0 A/W in order to simplify the calculation.

Comparing FIG. 24A and FIG. 25A, it can be seen that when the average input light power Pin_ave is 3 dBm, the THD is 5.2% in the third comparative example, whereas the THD is reduced to 4.1% in the third example. Comparing FIG. 24B and FIG. 25B, it can be seen that the amplitudes of the voltage signals Vtia are controlled to be equal to each other in the third comparative example and the third example. That is, it can be seen that although an amount of drawing of the AC bypass current Iagc1 in the third example is equivalent to that in the third comparative example, the THD of the third example is improved compared to the THD of the third comparative example.

In the third example, since the drain-source voltage Vds in the variable resistance circuit 53 and the drain-source voltage Vds in the variable resistance circuit 80 change complementarily, distortion of the resistance value $R_{AGC1}$ of the field effect transistor 57 is canceled by distortion of the resistance value $R_{AGC2}$ of the field effect transistor 82. That is, a connection destination of the drain and source of the field effect transistor 82 is inverted with respect to (replaced with) the connection destination of the drain and source of the variable resistance circuit 53, so that when the drain-source voltage Vds in the variable resistance circuit 53 is a positive value, the drain-source voltage Vds in the field effect transistor 82 is a negative value. Therefore, as shown in Formulae (11) and (12), the variable resistance circuits 53 and 80 operate such that the distortion of the resistance value $R_{AGC1}$ of the field effect transistor 57 and the distortion of the resistance value $R_{AGC2}$ of the field effect transistor 82 are cancelled mutually.

As described above, in the transimpedance amplifier circuit 10C, the bypass circuit 15C generates the DC bypass current Iaoc, the AC bypass current Iagc1, and the AC bypass current Iagc2, and the DC bypass current Iaoc, the AC bypass current Iagc1, and the AC bypass current Iagc2 are drawn from the photocurrent Ipd generated by the photodetector PD, so that the current signal Iin is generated. Then, the TIA unit 11 converts the current signal Iin into the voltage signal Vtia, and the differential amplifier circuit 13A generates the differential voltage signal Vout,Voutb in accordance with the difference ΔVtia between the voltage signal Vtia and the reference voltage signal Vref.

In the variable resistance circuit 53, the field effect transistor 56 is diode-connected, so that when the drain of the field effect transistor 56 receives the control current Iagc1cnt, the gate-source voltage Vgs2 is generated between the gate and source of the field effect transistor 56. The gate of the field effect transistor 56 and the gate of the field effect transistor 57 are electrically connected to each other, and the source of the field effect transistor 56 and the source of the field effect transistor 57 are electrically connected to each other, so that the gate-source voltage of the field effect transistor 57 is equal to the gate-source voltage Vgs2. The reference voltage signal Vref is supplied to the source of the field effect transistor 57, and the drain of the field effect transistor 57 is electrically connected to the input terminal 10a. Therefore, there is almost no potential difference between the drain and source of the field effect transistor 57. As a result, the field effect transistor 57 operates in the (deep) triode region. Thus, the field effect transistor 57 functions as a variable resistor, and an output impedance of the drain of the field effect transistor 57 decreases.

Similarly, in the variable resistance circuit 80, the field effect transistor 81 is diode-connected, so that when the drain of the field effect transistor 81 receives the control current Iagc2cnt, the gate-source voltage Vgs3 is generated between the gate and source of the field effect transistor 81. The gate of the field effect transistor 81 and the gate of the field effect transistor 82 are electrically connected to each other, and the source of the field effect transistor 81 and the source of the field effect transistor 82 are electrically connected to each other. Therefore, the gate-source voltage of the field effect transistor 82 is equal to the gate-source voltage Vgs3. The reference voltage signal Vref is supplied to the drain of the field effect transistor 82, and the source of the field effect transistor 82 is electrically connected to the input terminal 10a. Therefore, there is almost no potential difference between the drain and source of the field effect transistor 82. As a result, the field effect transistor 82 operates in the (deep) triode region. Thus, the field effect transistor 82 functions as a variable resistor, and an output impedance of the source of the field effect transistor 82 decreases.

There is almost no potential difference between the drain and source of the field effect transistor 57, and there is almost no potential difference between the drain and source of the field effect transistor 82. Thus, although the DC component of the photocurrent Ipd hardly flows into the field effect transistors 57 and 82, the AC component of the photocurrent Ipd may flow as the AC bypass currents Iagc1 and Iagc2 into the field effect transistors 57 and 82. The control currents Iagc1cnt and Iagc2cnt are obtained by amplifying a difference (difference current) between a current generated by amplifying the control current Icnt and the offset current Iofs with the amplification factor γ. Therefore, when the control current Icnt exceeds the current value of the offset current Iofs, the control currents Iagc1cnt and Iagc2cnt increase as the control current Icnt increases, and the gate-source voltages Vgs2 and Vgs3 also increase. Thus, when the photocurrent Ipd has a small or medium signal intensity, the drawing of the AC bypass currents Iagc1 and Iagc2 are suppressed, so that the attenuation of the AC component of the photocurrent Ipd can be avoided. When the photocurrent Ipd has a large signal intensity, the AC component of the photocurrent Ipd is drawn as the AC bypass currents Iagc1 and Iagc2 from the photocurrent Ipd, so that the AC component of the photocurrent Ipd can be attenuated. Thus, the variable resistance circuits 53 and 80 control a gain of the transimpedance amplifier circuit 10C.

Since the resistance value $R_{AGC1}$ of the field effect transistor 57 and the resistance value $R_{AGC2}$ of the field effect transistor 82 of the variable resistance circuit 80 include the component of the drain-source voltage Vds, the resistance values $R_{AGC1}$ and $R_{AGC2}$ can be changed by the drain-source voltage Vds. In the field effect transistor 57, the reference voltage signal Vref is supplied to the source, and the drain is electrically connected to the input terminal 10a. On the other hand, in the field effect transistor 82, the reference voltage signal Vref is supplied to the drain, and the source is electrically connected to the input terminal 10a. Thus, the polarity of the drain-source voltage Vds of the field effect transistor 57 and the polarity of the drain-source voltage Vds of the field effect transistor 82 are opposite to each other. Therefore, in the combined resistance value $R_{AGCT}$ of the variable resistance circuit 53 and the variable resistance circuit 80 viewed from the input terminal 10a, the component of the drain-source voltage Vds of the field effect transistor 57 and the component of the drain-source voltage Vds of the field effect transistor 82 are cancelled out each other. As a result, the variation of the combined resistance value $R_{AGCT}$ due to the drain-source voltage Vds of the field effect transistor 57 and the drain-source voltage Vds of the field effect transistor 82 is suppressed. As a result, since occurrence of distortion is suppressed, a signal quality can be improved.

The gain of the transimpedance amplifier circuit 10C changes depending on a combined output impedance of an output impedance of the resistance terminal 53b and an output impedance of the resistance terminal 80c. The combined output impedance may be determined in consideration of the input impedance Zin of the TIA unit 11, similarly to the output impedance of the resistance terminal 53b of the variable resistance circuits 53 and 53B. For example, when a variable gain ratio of the TIA unit 11 is A (A is a real number larger than 1), the combined output impedance is set to Zin/(A−1). Thus, when the value of the current signal Iin of the TIA unit 11 when the AGC is not performed is Iinoff, a value Iinon of the current signal Iin when the AGC is performed is Iinon=Iinoff/A. For example, when A=2, the combined output impedance is substantially equal to Zin, and when A is larger than 2, the combined output impedance is a value smaller than Zin. Therefore, when the AOC and the AGC are performed simultaneously, the output impedance of the output terminal 52b is set to be larger than the combined output impedance. When the AGC is not performed, the combined output impedance may be set to 100×Zin or more. The combined output impedance may be considered to be equal to the combined resistance value $R_{AGCT}$ described above. Since the input impedance Zin and the combined output impedance may have different frequency characteristics from each other, it is sufficient that the above-described relationship is satisfied at least in a predetermined frequency range (band).

The bypass circuit 15C includes the feedback current source 52 that generates the DC bypass current Iaoc based on the control current Icnt, the variable resistance circuit 53C that generates the AC bypass current Iagc1 based on the control current Icnt, and the variable resistance circuit 80 that generates the AC bypass current Iagc2 based on the control current Icnt. The control circuit 51C controls the feedback current source 52 so that the DC bypass current Iaoc increases as the control current Icnt increases, and controls the variable resistance circuits 53 and 80 so that the AC bypass currents Iagc1 and Iagc2 increase as the control current Icnt increases when the control current Icnt exceeds the current value of the offset current Iofs. According to this configuration, it is possible to realize the control (DC offset control) for removing the DC component and the gain control for the transimpedance amplifier circuit 10C with a single control loop, so that the increase of the circuit scale can be suppressed.

In the feedback current source 52, the field effect transistor 54 is diode-connected, so that when the drain of the field effect transistor 54 receives the control current Iaoccnt, the gate-source voltage Vgs1 is generated between the gate and source of the field effect transistor 54. The gate of the field effect transistor 54 and the gate of the field effect transistor 55 are electrically connected to each other, and the source of the field effect transistor 54 and the source of the field effect transistor 55 are electrically connected to each other, so that the gate-source voltage of the field effect transistor 55 is equal to the gate-source voltage Vgs1. The source of the field effect transistor 55 is electrically connected to the source of the field effect transistor 54, that is, the ground potential GND, and the drain of the field effect transistor 55 is electrically connected to the input terminal 10a, so that a potential difference between the source and drain of the field effect transistor 55 increases. As a result, the field effect transistor 55 operates in the saturation region. Thus, the field effect transistor 55 functions as a current source, and an output impedance of the drain of the field effect transistor 55 increases. Thus, although the AC component of the photocurrent Ipd hardly flows into the field effect transistor 55, the DC component of the photocurrent Ipd may flow as the DC bypass current Iaoc into the field effect transistor 55. Then, as the control current Icnt increases, the gate-source voltage Vgs1 of the field effect transistor 54 increases, so that the drain current of the field effect transistor 55 increases accordingly. As a result, the DC component of the photocurrent Ipd is drawn as the DC bypass current Iaoc from the photocurrent Ipd, and the DC component is suitably removed from the photocurrent Ipd. The magnitude of the output impedance of the output terminal 52b may be determined in consideration of the input impedance of the TIA unit 11. For example, when the input impedance of the TIA unit 11 is Zin, the output impedance of the output terminal 52b may be set to 100×Zin or more. Since the input impedance Zin and the output impedance of the output terminal 52b may have different frequency characteristics from each other, it is sufficient that such a relationship is satisfied at least in a predetermined frequency range (band).

In the variable resistance circuit 80, the control current Iagc2cnt flows from the drain to the source of the field effect transistor 81. Since the source of the field effect transistor 81 is electrically connected to the input terminal 10a, the control current Iagc2cnt flows out to the input terminal 10a (input terminal of the TIA unit 11) and increases the DC component of the photocurrent Ipd. On the other hand, since the DC bypass current Iaoc is set to include the control current Iagc2cnt, the DC component caused by the control current Iagc2cnt can be removed from the photocurrent Ipd. As a result, occurrence of DC offset in the potential of the voltage signal Vtia due to the control current Iagc2cnt can be suppressed.

The reference voltage generation circuit 12 includes the voltage amplifier 12a and the feedback resistance element 12b electrically connected between the input and output of the voltage amplifier 12a. With this configuration, the output impedance of the reference voltage generation circuit 12 is low in a wide frequency range. That is, the impedance of the variable resistance circuits 53 and 80 viewed from the input terminal of the TIA unit 11 is low in a wide frequency range. Thus, the AC bypass currents Iagc1 and Iagc2 can be easily drawn from the photocurrent Ipd.

Since the DC offset control is performed using the high-impedance feedback current source 52, the AC component of the photocurrent Ipd is less affected (the AC component does not flow to the feedback current source 52). On the other hand, the gain control is performed by bypassing the AC component of the photocurrent Ipd using the variable resistance circuits 53 and 80, and the drain potential and the source potential of the field effect transistors 57 and 82 are substantially equal to each other. Therefore, the DC component of the photocurrent Ipd is less affected (no DC component flows to the variable resistance circuits 53 and 80). As a result, interference between the control of the removal of the DC component and the gain control can be avoided.

As described above, according to the transimpedance amplifier circuit 10C, the gain control of the transimpedance amplifier circuit 10C and the DC offset control for setting the difference ΔVtia to 0 can be performed by a single control loop without interfering with each other, and the gain control can be performed with low distortion.

The transimpedance amplifier circuit according to the present disclosure is not limited to the above embodiments. The circuit configurations of the TIA unit 11, the reference voltage generation circuit 12, the differential amplifier circuit 13A, the control current circuit 14A, and the bypass circuits 15, 15B, and 15C are not limited to the configurations shown in the above embodiments. For example, the TIA unit 11 is only required to be configured to convert the current signal Iin into the voltage signal Vtia. The reference voltage generation circuit 12 is only required to be configured to be able to supply the reference voltage signal Vref. The differential amplifier circuit 13A may not include the output amplifier 13b.

The control current circuit 14A may not include the diode 48. Even in this case, it becomes possible to suppress the variation of the control time constant due to the change in signal intensity of the burst optical signal. The control current circuit 14A may include, instead of the diode 48, another circuit element that clamps the difference ΔVin so as to prevent the difference ΔVin from falling below a predetermined negative value. The circuit configuration of the OTA 42A is not limited to the circuit configuration shown in FIGS. 4 and 7, and is only required to be configured to be able to generate the control current Icnt shown in FIG. 5. The OTA 42A may generate the control current Icnt of 0 or more of the control current Icnt shown in FIG. 5.

The circuit configuration of the control circuit 51 is not limited to the circuit configuration shown in FIG. 9, and is only required to be configured to be able to generate the control current Iaoccnt and the control current Iagc1cnt shown in FIG. 8. The circuit configuration of the control circuit 51C is not limited to the circuit configuration shown in FIG. 23, and is only required to be configured to be able to generate the control current Iaoccnt, the control current Iagc1cnt, and the control current Iagc2cnt shown in FIG. 22.

The feedback current source 52 is only required to be configured to be able to generate the DC bypass current Iaoc so that the DC bypass current Iaoc increases as the control current Iaoccnt increases. Instead of the diode-connected field effect transistor 54, the feedback current source 52 may include, for example, a resistance element (resistor) provided so as to change the gate-source voltage of the field effect transistor 55 depending on the control current Iaoccnt. The source of the field effect transistor 55 does not have to be electrically connected to the ground potential GND, and it is sufficient that the source potential of the field effect transistor 55 is set so that the field effect transistor 55 operates in the saturation region. That is, the source potential of the field effect transistor 55 is set so that the drain potential of the field effect transistor 55 is higher than the source potential of the field effect transistor 55.

The variable resistance circuit 53 is only required to be configured to be able to generate the AC bypass current Iagc1 so that the AC bypass current Iagc1 increases as the control current Iagc1cnt increases. The variable resistance circuit 53 may include, instead of the diode-connected field effect transistor 56, a resistance element (resistor) provided so as to change the gate-source voltage of the field effect transistor 57 depending on the control current Iagc1cnt. The source of the field effect transistor 57 does not have to be electrically connected to the output terminal of the reference voltage generation circuit 12, and it is sufficient that the source potential of the field effect transistor 57 is set so that the field effect transistor 57 operates in the triode region. That is, the source potential of the field effect transistor 57 is set so that the drain potential of the field effect transistor 57 and the source potential of the field effect transistor 57 are substantially equal to each other.

The transimpedance amplifier circuits 10A, 10B, and 10C may not include the reference voltage generation circuit 12, and the reference voltage signal Vref may be supplied from an external reference voltage generation circuit to the transimpedance amplifier circuits 10A, 10B, and 10C.

In the above embodiments, the magnitude of the control current Iaoccnt (DC bypass current Iaoc) is adjusted by the amplification factor α; however, instead of this, the magnitude of the control current Iaoccnt may be adjusted by the current mirror ratio of the transistors 61 and 62 or both the amplification factor α and the current mirror ratio of the transistors 61 and 62. Similarly, the magnitude of the DC bypass current Iaoc may be adjusted by the current mirror ratio of the field effect transistors 54 and 55.

In the above embodiments, the magnitude of the control current Iagc1cnt (AC bypass current Iagc1) is adjusted by the amplification factor γ and the current values of the offset current Iofs; however, instead of the amplification factor γ, the magnitude of the control current Iagc1cnt may be adjusted by the current mirror ratio of the transistors 61 and 63 or the amplification factor γ, the current mirror ratio of the transistors 61 and 63, and the current value of the offset current Iofs. Similarly, the magnitude of the AC bypass current Iagc1 may be adjusted by the size of the field effect transistor 56, the size of the field effect transistor 57, and the like.

In the above embodiments, as the field effect transistors 54 and 55 and the transistors 21a to 21d, 22a to 22d, 23a, 24a, 25a, 25b, 61 to 69, 71, and 72, the field effect transistors have been used and described; however, the field effect transistors 54 and 55 and the transistors 21a to 21d, 22a to 22d, 23a, 24a, 25a, 25b, 61 to 69, 71, and 72 may be bipolar transistors. When the field effect transistors 54 and 55 and the transistors 21a to 21d, 22a to 22d, 23a, 24a, 25a, 25b, 61 to 69, 71, and 72 are bipolar transistors, the gate, source, and drain of the field effect transistor are replaceable by a base, an emitter, and a collector, respectively.

The bypass circuit 15 may not control the feedback current source 52 and the variable resistance circuit 53 with a single control loop. The bypass circuit 15B may not control the feedback current source 52 and the variable resistance circuit 53B with a single control loop. The bypass circuit 15C may not control the feedback current source 52, the variable resistance circuit 53, and the variable resistance circuit 80 with a single control loop.

Since the influence of the potential of the substrate terminal of the field effect transistor 57 on the gate potential is not so large, the variable resistance circuit 53B may not include the resistance element 59 (that is, resistance value Rb=0), and the field effect transistor 57 does not have to be configured such that the capacitance Cdb and the capacitance Csb are equal to each other. Even in this case, the variation of the differential resistance value (resistance value $R_{AGC1}$) of the field effect transistor 57 due to the drain-source voltage Vds is suppressed. As a result, since occurrence of distortion is suppressed, a signal quality can be improved.

Generally, an input impedance of a dummy TIA is about 10 to 100Ω similarly to the input impedance of the TIA unit 11, and an output impedance of the dummy TIA is about several Ω. Since both the input terminal and the output terminal of the dummy TIA generate the reference voltage signals Vref having substantially the same potential, either terminal may be used as the output terminal of the reference voltage generation circuit 12. Since the output impedance of the dummy TIA is lower than the input impedance, the resistance value $R_{AGC1}$ and resistance value $R_{AGC2}$ can be increased by using the output terminal of the dummy TIA as the output terminal of the reference voltage generation circuit 12, and the sizes of the field effect transistors 57 and 82 can be reduced. In other words, since parasitic capacitances of the field effect transistors 57 and 82 can be reduced, high frequency characteristics of the transimpedance amplifier circuit 10C can be improved.

In the transimpedance amplifier circuit 10C, the field effect transistor 57 and the field effect transistor 82 are transistors having the same structure, have the same size, and have the same electrical characteristics. However, the electrical characteristics of the field effect transistor 57 do not have to match the electrical characteristics of the field effect transistor 82. Even in this case, the variable resistance circuits 53 and 80 can reduce the influence of the drain-source voltage Vds, and can compensate the non-linearity of the combined resistance value $R_{AGCT}$.

What is claimed is:

1. A transimpedance amplifier circuit configured to generate a differential voltage signal in accordance with an input current signal generated by a photodetector, the transimpedance amplifier circuit comprising:
   an input terminal configured to receive the input current signal;
   a single-input amplifier configured to convert a current signal into a voltage signal;
   a differential amplifier circuit configured to generate the differential voltage signal based on the voltage signal and a reference voltage signal;
   a control current circuit configured to generate a control current based on the voltage signal and the reference voltage signal; and
   a bypass circuit configured to generate a direct current (DC) bypass current and an alternating current (AC) bypass current based on the control current, the bypass circuit being electrically connected to the input terminal, wherein
   the bypass circuit includes a control circuit configured to receive the control current, a feedback current source configured to generate the DC bypass current, and a variable resistance circuit configured to generate the AC bypass current,
   the control current circuit includes an integrating circuit configured to generate a differential integral signal based on the voltage signal and the reference voltage signal, and a transconductance amplifying circuit configured to receive the differential integral signal, the transconductance amplifying circuit includes a first transconductance circuit, a second transconductance circuit, and a current source, the first transconductance circuit is configured to generate a first output current in accordance with the differential integral signal, the second transconductance circuit is configured to generate a second output current in accordance with the differential integral signal, and the current source is configured to supply a third output current, and the control circuit has an input electrically connected to an output of the first transconductance circuit, an output of the second transconductance circuit, and an output of the current source.

2. The transimpedance amplifier circuit according to claim 1, wherein the transconductance amplifying circuit generates the control current by subtracting the first output current and the second output current from the third output current, the first transconductance circuit operates such that in a first range of values of the differential integral signal, the first output current decreases as the value of the differential integral signal increases, the second transconductance circuit operates such that in a second range of values of the differential integral signal, the second output current increases as the value of the differential integral signal increases, and an upper limit value of the second range is smaller than an upper limit value of the first range, and a lower limit value of the second range is larger than a lower limit value of the first range.

3. The transimpedance amplifier circuit according to claim 1, wherein the integrating circuit generates the differential integral signal by integrating a difference between the voltage signal and the reference voltage signal, the integrating circuit includes a first output configured to output a negative phase component of the differential integral signal, a second output configured to output a positive phase component of the differential integral signal, and a diode provided between the first output and the second output, and the diode has an anode electrically connected to the first output and a cathode electrically connected to the second output.

4. The transimpedance amplifier circuit according to claim 1, wherein the control circuit generates a first control current by amplifying the control current with a first amplification factor, the feedback current source includes
a first field effect transistor having a first drain configured to receive the first control current, a first gate electrically connected to the first drain, and a first source electrically connected to a ground potential, and
a second field effect transistor having a second drain electrically connected to the input terminal, a second gate electrically connected to the first drain and the first gate, and a second source electrically connected to the first source, and the feedback current source causes the DC bypass current to flow from the second drain to the second source in accordance with the first control current.

5. The transimpedance amplifier circuit according to claim 1, wherein the control circuit generates an offset current set to an offset current value and generates a second control current by amplifying a current that is a difference between the control current and the offset current with a second amplification factor, the variable resistance circuit includes
a third field effect transistor having a third drain configured to receive the second control current, a third gate electrically connected to the third drain, and a third source to which the reference voltage signal is supplied, and
a fourth field effect transistor having a fourth drain electrically connected to the input terminal, a fourth gate electrically connected to the third drain and the third gate, and a fourth source electrically connected to the third source, and the variable resistance circuit draws the AC bypass current from the input current signal in accordance with the second control current.

6. The transimpedance amplifier circuit according to claim 5, wherein the variable resistance circuit further includes a first resistor, the third field effect transistor further has a first substrate terminal to which the reference voltage signal is supplied, the fourth field effect transistor further has a second substrate terminal to which the reference voltage signal is supplied, the fourth gate is electrically connected to the third drain and the third gate via the first resistor, in the fourth field effect transistor, a first capacitance between the fourth gate and the fourth drain and a second capacitance between the fourth gate and the fourth source are equal to each other, and a resistance value of the first resistor is larger than an impedance due to the first capacitance.

7. The transimpedance amplifier circuit according to claim 6, wherein the variable resistance circuit further includes a second resistor, the reference voltage signal is supplied to the second substrate terminal via the second resistor, in the fourth field effect transistor, a third capacitance between the second substrate terminal and the fourth drain and a fourth capacitance between the second substrate terminal and the fourth source are equal to each other, and a resistance value of the second resistor is larger than an impedance due to the third capacitance.

8. The transimpedance amplifier circuit according to claim 5, wherein the bypass circuit further draws another AC bypass current from the input current signal in accordance with a third control current, the bypass circuit further includes another variable resistance circuit configured to generate the another AC bypass current based on the third control current, the control circuit generates the third control current by amplifying the difference current with the second amplification factor, and the another variable resistance circuit includes
a fifth field effect transistor having a fifth drain configured to receive the third control current, a fifth gate electrically connected to the fifth drain, and a fifth source electrically connected to the input terminal, and a sixth field effect transistor having a sixth drain to which the reference voltage signal is supplied, a sixth gate electrically connected to the fifth drain and the fifth gate, and a sixth source electrically connected to the fifth source.

9. The transimpedance amplifier circuit according to claim 8, wherein the DC bypass current is set so as to include the third control current flowing out from the another variable resistance circuit.

10. The transimpedance amplifier circuit according to claim 1, further comprising a reference voltage generation circuit configured to generate the reference voltage signal, wherein the reference voltage generation circuit includes an amplifier and a feedback resistor electrically connected between an input and an output of the amplifier.

11. A transimpedance amplifier circuit configured to generate a differential voltage signal in accordance with an input current signal generated by a photodetector, the transimpedance amplifier circuit comprising:

an input terminal configured to receive the input current signal;

a single-input amplifier having an input node, the single-input amplifier being configured to receive a current signal via the input node and convert the current signal into a voltage signal, the input node being electrically connected to the input terminal;

a differential amplifier circuit having a first input and a second input, the differential amplifier circuit being configured to receive the voltage signal via the first input and a reference voltage via the second input, and to generate the differential voltage signal;

a control current circuit having a third input and a fourth input, the control current circuit being configured to receive the voltage signal via the third input and the reference voltage via the fourth input, and to generate a control current; and a bypass circuit configured to generate a direct current (DC) bypass current and an alternating current (AC) bypass current based on the control current, the bypass circuit being electrically connected to the input terminal, wherein the bypass circuit includes a control circuit, a feedback current source, and a variable resistance circuit, the control circuit generates a first control current and a second control current, the feedback current source has a first terminal electrically connected to the input terminal and the input node of the single-input amplifier and a second terminal electrically connected to a ground line, and generates the DC bypass current flowing from the first terminal to the second terminal in accordance with the first control current, the variable resistance circuit has a third terminal electrically connected to the input terminal and the input node of the single-input amplifier and a fourth terminal receiving the reference voltage, and draws the AC bypass current from the input current signal by varying a resistance between the third terminal and the fourth terminal in accordance with the second control current, the control current circuit includes an integrating circuit and a transconductance amplifying circuit, the integrating circuit has a fifth input and a sixth input, the fifth input is electrically connected to the third input, the sixth input is electrically connected to the fourth input, and the integrating circuit generates a differential integral signal, the transconductance amplifying circuit has an output node and outputs the control current from the output node in accordance with the differential integral signal, the transconductance amplifying circuit includes a first transconductance circuit, a second transconductance circuit, and a current source, the first transconductance circuit has a first output electrically connected to the output node and draws an first output current via the first output in accordance with the differential integral signal, the second transconductance circuit has a second output electrically connected to the output node and draws a second output current via the second output in accordance with the differential integral signal, and the current source has a third output electrically connected to the output node and supplies a third output current from the third output.

* * * * *